United States Patent
Liu et al.

(10) Patent No.: US 8,325,446 B1
(45) Date of Patent: Dec. 4, 2012

(54) DISK DRIVE HEAD GIMBAL ASSEMBLY HAVING A FLEXURE TAIL WITH FEATURES TO FACILITATE BONDING

(75) Inventors: Yanning Liu, San Ramon, CA (US); Wing C. Shum, San Mateo, CA (US); Tzong-Shii Pan, San Jose, CA (US); Kia Moh Teo, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/164,936

(22) Filed: Jun. 21, 2011

Related U.S. Application Data

(63) Continuation-in-part of application No. 13/078,829, filed on Apr. 1, 2011, which is a continuation-in-part of application No. 12/916,237, filed on Oct. 29, 2010.

(51) Int. Cl.
*G11B 5/127* (2006.01)

(52) U.S. Cl. .................................................. 360/245.9

(58) Field of Classification Search ............... 360/245.4, 360/234.5, 245, 245.3, 245.7, 245.9, 244.2, 360/244.5, 244.3, 234.6, 245.1, 245.6, 264.2, 360/244.9
See application file for complete search history.

(56) References Cited

U.S. PATENT DOCUMENTS

| | | | |
|---|---|---|---|
| 5,465,186 A * | 11/1995 | Bajorek et al. ............... 360/323 |
| 5,861,661 A | 1/1999 | Tang et al. |
| 5,903,056 A | 5/1999 | Canning et al. |
| 6,036,813 A | 3/2000 | Schulz et al. |
| 6,228,689 B1 | 5/2001 | Liu |
| 6,351,352 B1 * | 2/2002 | Khan et al. ............... 360/264.2 |
| 6,381,099 B1 | 4/2002 | Mei |
| 6,382,499 B1 | 5/2002 | Satoh et al. |
| 6,614,623 B2 | 9/2003 | Nakamura et al. |
| 6,639,757 B2 | 10/2003 | Morley et al. |
| 6,656,772 B2 | 12/2003 | Huang |
| 6,703,566 B1 | 3/2004 | Shiraishi et al. |
| 6,757,137 B1 | 6/2004 | Mei |
| 6,992,862 B2 | 1/2006 | Childers et al. |
| 7,075,701 B2 | 7/2006 | Novotny et al. |
| 7,154,708 B2 | 12/2006 | Chhabra et al. |
| 7,205,484 B2 | 4/2007 | Shiraishi et al. |
| 7,245,458 B2 | 7/2007 | Zhang et al. |
| 7,298,593 B2 | 11/2007 | Yao et al. |
| 7,359,154 B2 | 4/2008 | Yao et al. |
| 7,372,669 B2 | 5/2008 | Deguchi et al. |

(Continued)

OTHER PUBLICATIONS

Notice of Allowance dated May 21, 2012 from U.S. Appl. No. 13/398,578, 16 pages.

(Continued)

*Primary Examiner* — Allen Cao

(57) ABSTRACT

A head gimbal assembly for a disk drive includes a read head and a suspension assembly. The suspension assembly includes a load beam and a laminate flexure. The laminate flexure includes a structural layer, a dielectric layer, and a conductive layer that includes a plurality of electrical traces. The laminate flexure includes a tongue portion that connects to the read head and a flexure tail that extends away from the tongue portion. The flexure tail includes a plurality of flexure bond pads. Each of the plurality of flexure bond pads includes a widened region of a corresponding one of the plurality of electrical traces in the conductive layer, and a corresponding one of a plurality of segments or discontinuous islands in the structural layer.

38 Claims, 12 Drawing Sheets

U.S. PATENT DOCUMENTS

| | | | |
|---|---|---|---|
| 7,375,874 B1 | 5/2008 | Novotny et al. | |
| 7,388,733 B2 | 6/2008 | Swanson et al. | |
| 7,394,139 B2 | 7/2008 | Park et al. | |
| 7,414,814 B1 | 8/2008 | Pan | |
| 7,440,236 B1 | 10/2008 | Bennin et al. | |
| 7,450,346 B2 | 11/2008 | Arya et al. | |
| 7,515,240 B2 | 4/2009 | Lu et al. | |
| 7,525,769 B2 | 4/2009 | Yao et al. | |
| 7,652,890 B2 | 1/2010 | Ohsawa et al. | |
| 7,697,102 B2 | 4/2010 | Hirakata et al. | |
| 7,764,467 B2 | 7/2010 | Hanya et al. | |
| 7,876,664 B2 | 1/2011 | Tsukagoshi et al. | |
| 8,015,692 B1 * | 9/2011 | Zhang et al. | 29/603.14 |
| 8,030,576 B2 * | 10/2011 | Kamei et al. | 174/255 |
| 8,111,483 B2 | 2/2012 | Arai | |
| 2001/0017749 A1 | 8/2001 | Stefansky | |
| 2005/0030670 A1 | 2/2005 | Ando et al. | |
| 2005/0243472 A1 | 11/2005 | Kamigama et al. | |
| 2006/0098347 A1 | 5/2006 | Yao et al. | |
| 2006/0146262 A1 | 7/2006 | Yu et al. | |
| 2006/0157869 A1 | 7/2006 | Huang et al. | |
| 2007/0246251 A1 | 10/2007 | Shiraishi et al. | |
| 2008/0002303 A1 | 1/2008 | Wang et al. | |
| 2008/0068757 A1 | 3/2008 | Kamigama et al. | |
| 2008/0088975 A1 | 4/2008 | Bennin et al. | |
| 2008/0225439 A1 | 9/2008 | Komura | |
| 2009/0151994 A1 | 6/2009 | Ohsawa et al. | |
| 2009/0211789 A1 | 8/2009 | Yeates et al. | |
| 2009/0253233 A1 | 10/2009 | Chang et al. | |
| 2010/0118444 A1 | 5/2010 | Rothenberg et al. | |
| 2010/0176827 A1 | 7/2010 | Yamazaki et al. | |
| 2010/0188778 A1 | 7/2010 | Castagna | |
| 2010/0195474 A1 | 8/2010 | Tsukuda et al. | |
| 2011/0317309 A1 | 12/2011 | Shum et al. | |
| 2012/0067626 A1 | 3/2012 | Mizutani | |

OTHER PUBLICATIONS

Notice of Allowance dated May 29, 2012 from U.S. Appl. No. 13/164,959, 17 pages.

Notice of Allowance dated Apr. 11, 2012 from U.S. Appl. No. 13/078,829, 22 pages.

US 7,337,529, 03/2008, Bennin et al. (withdrawn)

* cited by examiner

DISK DRIVE HEAD GIMBAL ASSEMBLY HAVING A FLEXURE TAIL WITH FEATURES TO FACILITATE BONDING

CROSS-REFERENCE TO RELATED APPLICATIONS

This application is a continuation-in-part of pending U.S. patent application Ser. No. 13/078,829, filed Apr. 1, 2011, and entitled "Disk drive head gimbal assembly having a flexure tail with features to facilitate bonding," which is itself a continuation-in-part of pending U.S. patent application Ser. No. 12/916,237, filed Oct. 29, 2010, and entitled "Disk drive head gimbal assembly having a flexure tail with folded bond pads." Priority benefit is claimed herein from both of these pending patent applications, and both are incorporated herein by reference in their entirety.

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a modern magnetic hard disk drive device, each head is a sub-component of a head-gimbal assembly (HGA) that typically includes a laminated flexure to carry the electrical signals to and from the head. The HGA, in turn, is a sub-component of a head-stack assembly (HSA) that typically includes a plurality of HGAs, an actuator, and a flexible printed circuit (FPC). The plurality of HGAs are attached to various arms of the actuator.

Modern laminated flexures typically include conductive copper traces that are isolated from a stainless steel structural layer by a polyimide dielectric layer. So that the signals from/to the head can reach the FPC on the actuator body, each HGA flexure includes a flexure tail that extends away from the head along a corresponding actuator arm and ultimately attaches to the FPC adjacent the actuator body. That is, the flexure includes traces that extend from adjacent the head and continue along the flexure tail to electrical connection points. The FPC includes conductive electrical terminals that correspond to the electrical connection points of the flexure tail.

To facilitate electrical connection of the conductive traces of the flexure tails to the conductive electrical terminals of the FPC during the HSA manufacturing process, the flexure tails must first be properly positioned relative to the FPC so that the conductive traces of the flexure tails are aligned with the conductive electrical terminals of the FPC. Then the flexure tails must be held or constrained against the conductive electrical terminals of the FPC while the aforementioned electrical connections are made (e.g. by ultrasonic bonding, solder jet bonding, or solder bump reflow).

However, recently for some disk drive products, the aforementioned electrical connections may employ a type of anisotropic conductive film (ACF) bonding. An anisotropic conductive film is typically an adhesive doped with conductive beads or cylindrical particles of uniform or similar diameter. As the doped adhesive is compressed and cured, it is heated and squeezed between the surfaces to be bonded with sufficient uniform pressure that a single layer of the conductive beads makes contact with both surfaces to be bonded. In this way, the thickness of the adhesive layer between the bonded surfaces becomes approximately equal to the size of the conductive beads. The cured adhesive film may conduct electricity via the contacting beads in a direction normal to the bonded surfaces (though may not necessarily conduct electricity parallel to the bonded surfaces, since the beads may not touch each other laterally—though axially each bead is forced to contact both of the surfaces to be bonded—hence the term "anisotropic").

Maintaining sufficient uniform pressure during adhesive curing, such that a single layer of conductive beads in an ACF makes contact with both opposing surfaces to be bonded, may be achievable for existing HGA designs using a tool that presses only upon a single bond pad. However, in a high-volume manufacturing environment like that necessitated by the very competitive information storage device industry, there is a practical requirement for fast, cost-effective, and robust bonding of many bond pads simultaneously; bonding one bond pad at a time simply takes too much time.

Accordingly, there is a need in the art for an improved HGA design that may facilitate the application of more uniform pressure and temperature to groups of bond pads, to more quickly accomplish reliable electrical connection of the conductive traces of a flexure tail to the conductive electrical terminals of a FPC (e.g. by ACF or by any other bonding method that benefits from a more uniform bonding pressure and temperature) during HSA manufacture.

DESCRIPTION OF THE PREFERRED EMBODIMENTS

Figure 1:
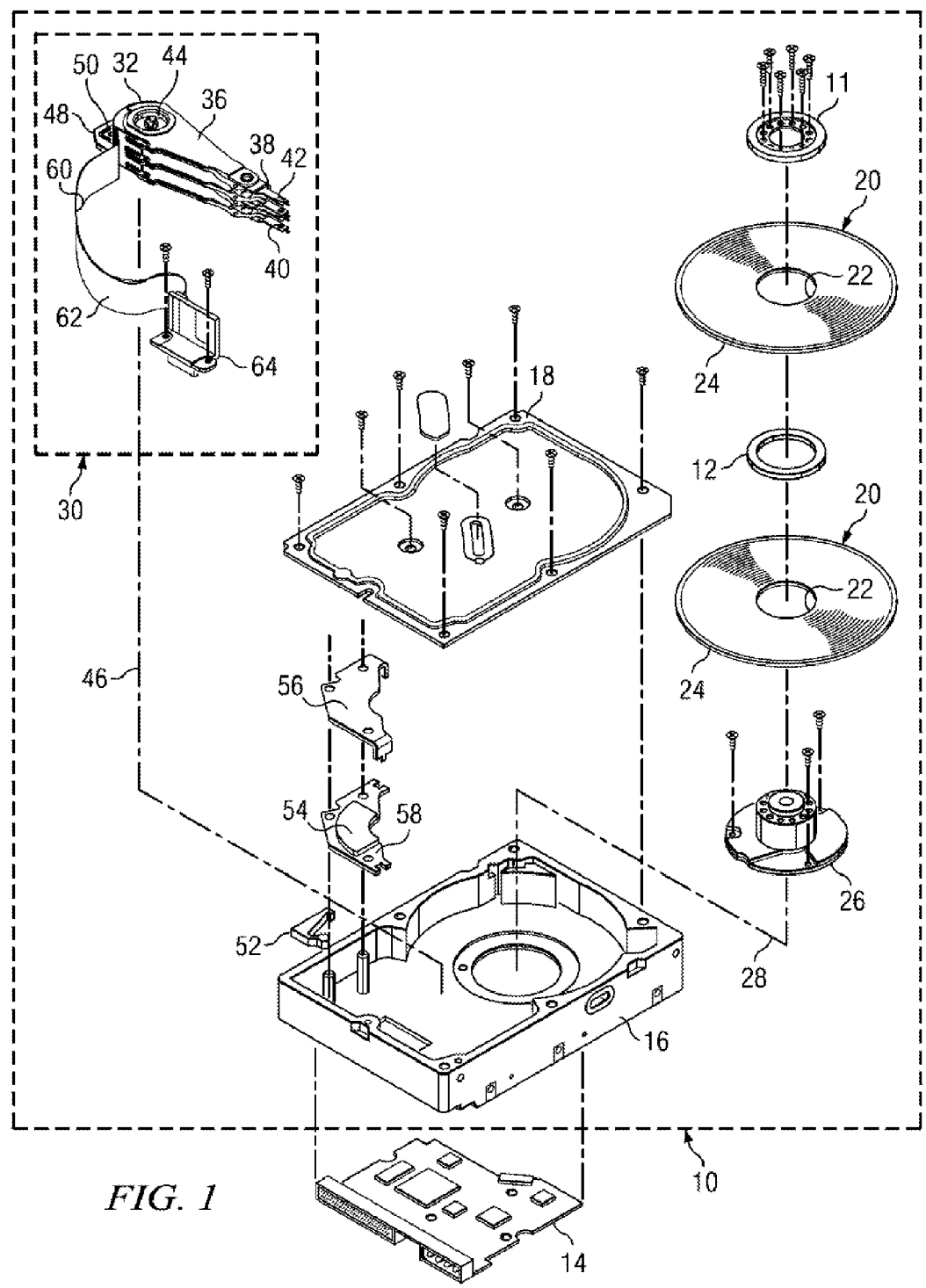
FIG. 1 is an exploded perspective view of a disk drive according to an embodiment of the present invention.

FIG. 1 is an exploded perspective view of a disk drive according to an example embodiment of the present invention. The disk drive includes a head disk assembly (HDA) 10 and a printed circuit board assembly (PCBA) 14. The HDA 10 includes a base 16 and cover 18 that together house at least one annular magnetic disk 20. Each disk 20 contains a plurality of magnetic tracks for storing data. The tracks are disposed upon opposing first and second disk surfaces of the disk 20 that extend between an inner disk edge 22 (corresponding to the inner diameter) and an outer disk edge 24 (corresponding to the outer diameter) of the disk 20. The head disk assembly 10 further includes a spindle motor 26 for rotating the disk 20 about a disk axis of rotation 28. The spindle motor 26 includes a spindle motor hub that is rotatably attached to the base 16 of the HDA 10. Disks 20 may be stacked and separated with one or more annular disk spacers 12 that are disposed about the hub, all held fixed to the hub by disk clamp 11.

The HDA 10 further includes a head stack assembly (HSA) 30 rotatably attached to the base 16 of HDA 10. The HSA 30 includes an actuator comprising an actuator body 32 and one or more actuator arms 36 extending from the actuator body 32. The actuator body 32 includes a bore 44 and a pivot bearing cartridge engaged within the bore for facilitating the HSA 30 to rotate relative to HDA 10 about actuator pivot axis 46. One or two head gimbal assemblies (HGA) 38 are attached to a distal end of each actuator arm 36. Each HGA includes a head (e.g. head 40) for reading and writing data from and to the disk 20, and a load beam 42 to compliantly preload the head against the disk 20. The HSA 30 further includes a coil support 48 that extends from one side of the HSA 30 that is opposite head 40. The coil support 48 is configured to support a coil 50 through which a controlled electrical current is passed. The coil 50 interacts with one or more magnets 54 that are attached to base 16 via a yoke structure 56, 58 to form a voice coil motor for controllably rotating the HSA 30. HDA 10 includes a latch 52 rotatably mounted on base 16 to prevent undesired rotations of HSA 30.

The PCBA 14 includes a servo control system for generating servo control signals to control the current through the coil 50 and thereby position the HSA 30 relative to tracks disposed upon surfaces of disk 20. The HSA 30 is electrically connected to PCBA 14 via a flexible printed circuit (FPC) 60, which includes a flex cable 62 and a flex cable support bracket 64. The flex cable 62 supplies current to the coil 50 and carries signals between the HSA 30 and the PCBA 14.

In the magnetic hard disk drive of FIG. 1, the head 40 includes a body called a "slider" that carries a magnetic transducer on its trailing end (not visible given the scale of FIG. 1). The magnetic transducer may include an inductive write element and a magnetoresistive read element. During operation the transducer is separated from the magnetic disk by a very thin hydrodynamic air bearing. As the motor 26 rotates the magnetic disk 20, the hydrodynamic air bearing is formed between an air bearing surface of the slider of head 40, and a surface of the magnetic disk 20. The thickness of the air bearing at the location of the transducer is commonly referred to as "flying height."

Figure 2:
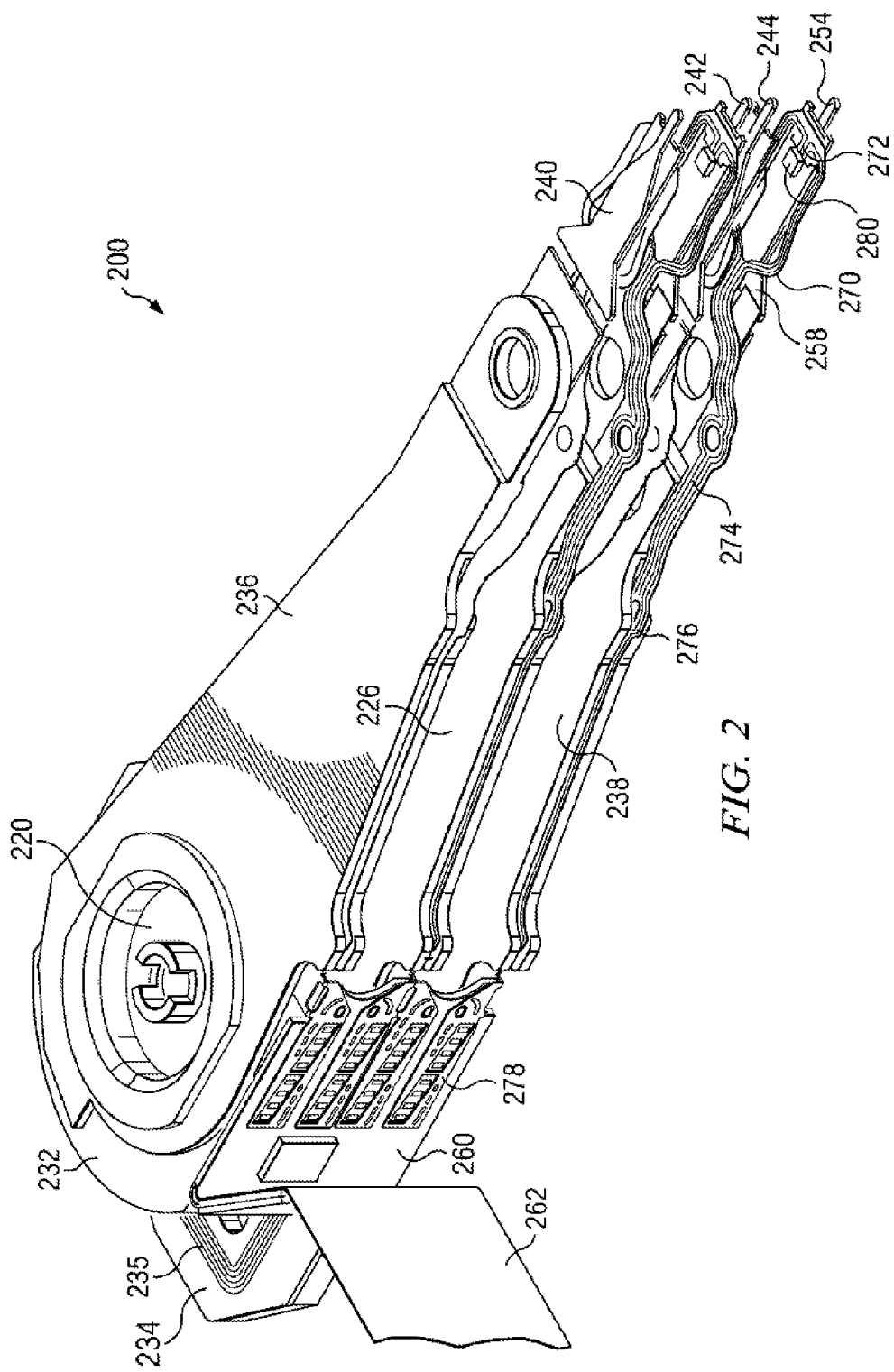
FIG. 2 is a perspective view of a head stack assembly (HSA) according to an embodiment of the present invention.

FIG. 2 is a perspective view of a head stack assembly (HSA) 200 according to an example embodiment of the present invention. The HSA 200 includes an actuator body 232 and a plurality of actuator arms 226, 236, 238 extending from the actuator body 232. The actuator body 232 includes a pivot bearing cartridge 220 disposed in the actuator bore, and a coil support 234 that supports a coil 235 and extends from the actuator body 232 in a direction that is generally opposite the actuator arms 226, 236, 238. The HSA 200 also includes a plurality of head gimbal assemblies (HGA) 240, 242, 244, 254, attached to the actuator arms 226, 236, 238. For example, such attachment may be made by swaging. Note that the inner actuator arm 226 includes two HGAs, while each of the outer actuator arms 236, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a dummy mass.

Each HGA includes a head for reading and/or writing to an adjacent disk surface (e.g. HGA 254 includes head 280). The head 280 is attached to a tongue portion 272 of a laminated flexure 270. The laminated flexure 270 is part of the HGA 254, and is attached to a load beam 258 (another part of the HGA 254). The laminated flexure 270 may include a structural layer (e.g. stainless steel), a dielectric layer (e.g. polymide), and a conductive layer into which traces are patterned (e.g. copper). The HSA 200 also includes a flexible printed circuit (FPC) 260 adjacent the actuator body 232, and the FPC 260 includes a flex cable 262. The FPC 260 may comprise a laminate that includes two or more conventional dielectric and conductive layer materials (e.g. one or more polymeric materials, copper, etc). The laminated flexure 270 includes a flexure tail 274 that includes an intermediate region 276 that is disposed adjacent the actuator arm 238, and a terminal region 278 that is electrically connected to bond pads of the FPC 260.

Methods of electrical connection of the flexure tails to the FPC 260 include ultrasonic bonding of gold coatings thereon, solder reflow, solder ball jet (SBJ), and anisotropic conductive film (ACF) bonding, and are preferably but not necessarily automated. To electrically connect and securely attach the flexure tails to the FPC 260, the flexure tails are first aligned with the FPC 260, and then pressed against the FPC 260 (at least temporarily) while electrical connection is established and secure attachment is completed. Maintaining sufficient uniform pressure and temperature to groups of bond pads may be desirable during this process, and may be facilitated by certain inventive structural features in the terminal regions of the flexure tails.

Figure 3:
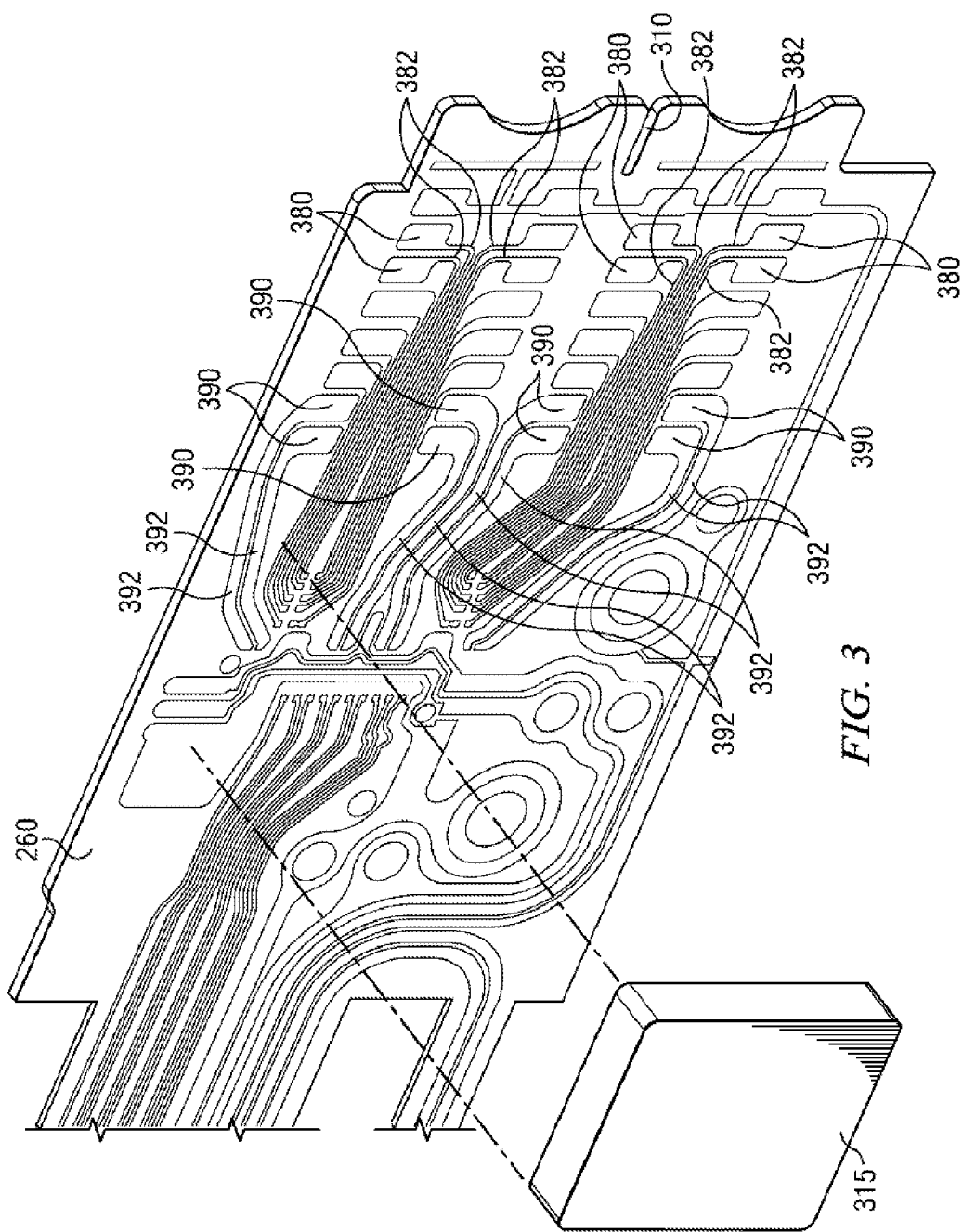
FIG. 3 is a perspective view of a portion of a flexible printed circuit (FPC) according to an embodiment of the present invention.

FIG. 3 depicts the FPC 260 before flexure tail terminal regions (e.g. flexure tail terminal region 278) are bonded thereto. The FPC 260 includes electrical conduits 382, 392 that terminate at FPC bond pads 380, 390, which are aligned with and connected to flexure bond pads of the terminal regions (e.g. flexure tail terminal region 278) of the HGA flexure tails. The FPC electrical conduits 382, 392 may connect to a pre-amplifier chip 315 (shown exploded from the FPC 260 in FIG. 3). Intermediate regions of two of the HGA flexure tails (e.g. flexure tail intermediate region 276) may pass through the FPC slit 310 to help facilitate their support and alignment.

The FPC 260 may include an optional insulative cover layer having windows exposing the regions where the flexure tail terminal regions and the pre-amplifier chip 315 are bonded thereto. Such cover layer is not shown in the view of FIG. 3, so that the electrical conduits 382, 392 could be shown without being obscured or partially obscured by the cover layer.

In the embodiment of FIG. 3, certain of the FPC electrical conduits 392 are wider than others 382. For example, in certain embodiments, those FPC bond pads that connect through to an inductive write element of a read/write head may be wider than those that connect through to a magetoresistive read element (e.g. a tunneling magneto-resistive read element) of the read/write head. However, during bonding of the FPC bond pads 380, 390 to flexure bond pads of the flexure tail terminal regions, those FPC bond pads 390 associated with the wider FPC electrical conduits 392 may conduct away more heat than the FPC bond pads 380 associated with narrower FPC electrical conduits 382. Therefore, to maintain more uniform temperature among the various bond pads during bonding, it may be advantageous to provide a greater amount of heat to the FPC bond pads 390 than to the FPC bond pads 380.

However, it may also be advantageous to enhance the speed and ease of the manufacturing process by simultaneously bonding all of the FPC bond pads 380, 390 with a relatively large and simple tool that cannot control the temperature applied to one bond pad independently from the temperature applied to another bond pad. Hence, it may be desirable to vary the heat flow into specific bond pads (relative to other bond pads) via design of certain structural aspects of the flexure tail terminal regions, as described in more detail subsequently herein.

Figure 4:
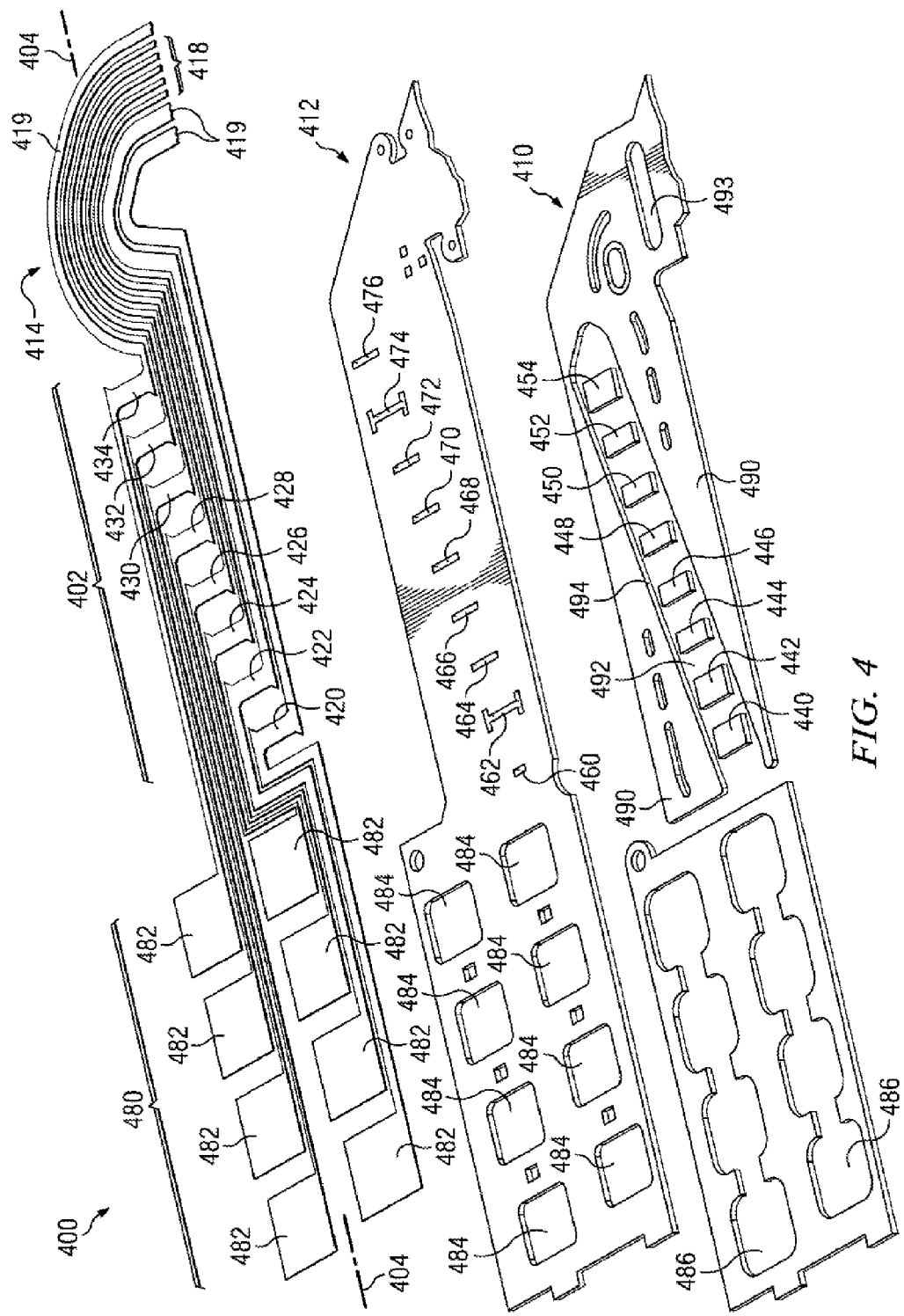
FIG. 4 is an exploded perspective view of a flexure tail terminal region, according to an embodiment of the present invention.

FIG. 4 is an exploded perspective view of a terminal region of a flexure tail 400, according to an embodiment of the present invention. The flexure tail 400 of the laminate flexure comprises a structural layer 410, a dielectric layer 412, and a conductive layer 414. In certain embodiments, the structural layer 410 comprises stainless steel, the dielectric layer 412 comprises polyimide, and the conductive layer 414 comprises copper, for example, though it is contemplated that other materials providing similar function might be used instead.

In the embodiment of FIG. 4, the conductive layer 414 of the flexure tail 400 includes five electrical traces 418 and three electrical traces 419. Each of the electrical traces 418 includes a corresponding one of a plurality of widened regions 424, 426, 428, 430, 432, in a non-disposable region 402 to be bonded to the FPC (e.g. FPC 260 shown in FIG. 3). In this context, "widened" means wider than the width of a trace 418 in an intermediate region where the flexure tail 400 runs along the arm (i.e. the width of a trace 418 at the right side of FIG. 4). Likewise, each of the electrical traces 419 includes a corresponding one of a plurality of widened regions 420, 422, 434, in the non-disposable region 402 to be bonded to the FPC (e.g. FPC 260 shown in FIG. 3). In this context, "widened" means wider than the width of a trace 419 in the intermediate region where the flexure tail 400 runs along the arm (i.e. the width of a trace 419 at the right side of FIG. 4).

Note that in the embodiment of FIG. 4, the traces 419 are wider in the intermediate region than the traces 418. For example, in certain embodiments, those traces 419 that connect through to an inductive write element of a read/write head may be wider than those traces 418 that connect through to a magetoresistive read element of the read/write head. However, others of the traces 418 and/or others of the traces 419 may connect to other subcomponents of the read/write head or HGA (e.g. microactuator, transducer heater, electronic lapping guide, etc), instead of to only an inductive writer or magneto-resistive read element.

For example, in the embodiment of FIG. 4, each of the traces 419 may define a first trace width in the range 80 microns to 230 microns, and each of the traces 418 may define a second trace width in the range 20 microns to 50 microns. Alternatively, if more than one trace 418, 419 is attached to a single widened region 420, 422, 424, 426, 428, 430, 432, or 434, then the first trace width may be considered as the sum of the widths of the attached traces, and may be in the range 80 microns to 230 microns. Each of the plurality of widened regions 420, 422, 424, 426, 428, 430, 432, 434 may be preferably aligned with a corresponding one of the plurality of FPC bond pads 380, 390 shown in FIG. 3.

As shown in FIG. 4, each of the widened regions 420, 422, 424, 426, 428, 430, 432, 434 may extend further transverse to the flexure tail longitudinal axis 404 than it extends parallel to the flexure tail longitudinal axis 404. In certain embodiments, such inequality may render the widened regions to be relatively less sensitive to transverse misalignment with the corresponding FPC bond pad 380 of FIG. 3. Such transverse misalignment during disk drive assembly may be caused by FPC position variability (e.g. due to alignment pin to hole clearance), and/or undesired movement of the flexure tail by a manufacturing employee. Note that, during disk drive assembly, a manufacturing employee may more easily misalign the terminal region of the flexure tail 400 transverse to the flexure tail longitudinal axis 404 than parallel to the flexure tail longitudinal axis 404, since the flexure is difficult to stretch, and so moves more easily in the transverse direction. In this context "parallel" does not imply perfectly parallel, but rather approximately parallel (e.g. ±10 degrees from perfectly parallel). Likewise, "transverse" does not imply perfectly perpendicular, but rather approximately perpendicular (e.g. ±10 degrees from perfectly perpendicular).

Also in the embodiment of FIG. 4, a plurality of discontinuous islands 440, 442, 444, 446, 448, 450, 452, 454 are defined in the structural layer 410 and are disposed in general alignment with corresponding widened regions in the conductive layer. For example, discontinuous island 440 is disposed in general alignment with widened region 420. In this context, an island in the structural layer 410 is considered to be discontinuous if it does not directly contact the rest of the structural layer 410, even if it is joined by a web or bridge in the dielectric layer 412 and/or the conductive layer 414. In the embodiment of FIG. 4, each widened region 420, 422, 424, 426, 428, 430, 432, 434, along with the corresponding discontinuous island 440, 442, 444, 446, 448, 450, 452, 454 with which it is aligned, defines a flexure bond pad or flexure bond pad location.

In the embodiment of FIG. 4, the structural layer 410 includes a peripheral frame 490 that defines and surrounds a structural layer window 492. As shown in FIG. 4, the discontinuous islands 440, 442, 444, 446, 448, 450, 452, 454 are disposed within the structural layer window 492. The peripheral frame 490 underlies a region of the plurality of electrical traces 418 where the traces are relatively narrow. Although the structural layer window 492 has a broken and open inner contour 494 in the embodiment of FIG. 4, it may be a closed and continuous inner contour in certain alternative embodiments.

In the embodiment of FIG. 4, the discontinuous islands in the structural layer 410 preferably increase the thickness of the flexure tail terminal region 400 at the locations of the flexure bond pads (e.g. at the location of the widened region 424). For example, the thickness of the structural layer may be preferably less than 20 microns, the thickness of the dielectric layer may be preferably less than 15 microns, the thickness of the conductive layer may be preferably less than 15 microns, while a total thickness of the flexure tail terminal region 400 at the flexure bond pads is preferably at least 25 microns. Such inequalities may enhance the utility of a non-patterned thermode tool to apply more uniform heat and pressure to the flexure bond pads during bonding.

In the embodiment of FIG. 4, each of the widened regions 420, 422, 424, 426, 428, 430, 432, 434 defines a widened region width that is measured parallel to the flexure tail longitudinal axis 404. For example, the widened region width may in the range 90 to 230 microns. Likewise, each of the plurality of discontinuous islands 440, 442, 444, 446, 448, 450, 452, 454 defines an island width that is measured parallel to the flexure tail longitudinal axis 404. Specifically, in the embodiment of FIG. 4, the plurality of discontinuous islands 440, 442, 444, 446, 448, 450, 452, 454 includes five discontinuous islands 444, 446, 448, 450, and 452, each having an island width that is not greater than the widened region width of widened regions 424, 426, 428, 430, 432, respectively. By contrast, however, the plurality of discontinuous islands 440, 442, 444, 446, 448, 450, 452, 454 also includes three discontinuous islands 440, 442, 454, each having an island width that is in the range 1.1 to 2 times the widened region width of widened regions 420, 422, and 434, respectively.

Hence, in the embodiment of FIG. 4, the island widths of the three discontinuous islands 440, 442, 454, are each greater than the island widths of the five discontinuous islands 444, 446, 448, 450, and 452. The foregoing inequalities may enable the terminal region of the flexure tail 400 to desirably allow a greater amount of heat to pass through the three discontinuous islands 440, 442, 454 (for bonding of the widened regions 420, 422, and 434), than through the five discontinuous islands 444, 446, 448, 450, and 452 (for bonding of the widened regions 424, 426, 428, 430, 432). The relatively greater heat flow through the discontinuous islands 440, 442, 454 may help maintain a more uniform temperature among the plurality of widened regions 420, 422, 424, 426, 428, 430, 432, 434 during bonding, because each of the three wider electrical traces 419 may conduct away more applied heat during bonding than each of the five narrower electrical traces 418.

In the embodiment of FIG. 4, the dielectric layer 412 electrically insulates the conductive traces 418 and 419 of the conductive layer 414 from the structural layer 410. Such electrical insulation may be desired because the structural layer 410 may be electrically conductive (e.g. stainless steel), and so otherwise the structural layer 410 may cause an electrical short between the traces 418 and 419 and/or from the traces 418 and 419 to ground. In the embodiment of FIG. 4, the dielectric layer 412 optionally includes a plurality of through openings 460, 462, 464, 466, 468, 470, 472, 474, 476. Each of the plurality of the openings 460, 462, 464, 466, 468, 470, 472, 474, 476 through the dielectric layer 412 may be disposed adjacent, but preferably not overlying, at least one of the plurality of discontinuous islands 440, 442, 444, 446, 448, 450, 452, 454 in the structural layer 410. In certain embodiments, the openings 460, 462, 464, 466, 468, 470, 472, 474, 476 through the dielectric layer 412 may serve an adhesive control purpose (e.g. to limit the spread of adhesive used during the flexure tail bonding process).

In the embodiment of FIG. 4, the flexure tail terminal region 400 optionally includes a disposable test pad region 480. Before the flexure tail terminal region 400 is bonded to an FPC (e.g. FPC 260 shown in FIG. 3), a plurality of test pads 482 in the conductive layer 414 may facilitate HGA testing. During HGA electrical testing, one or more test probes may contact the test pads 482. In the embodiment of FIG. 4, openings 484 through the dielectric layer 412 and openings 486 through the structural layer 410 may facilitate contact by the probes from either side of the test pads 482. After HGA testing, and before the bond pads of the flexure tail 400 are bonded to the FPC (e.g. FPC 260 shown in FIG. 3), all layers of the disposable test pad region 480 are preferably cut away from the flexure tail 400, so that only the non-disposable region 402 remains.

Figure 5:
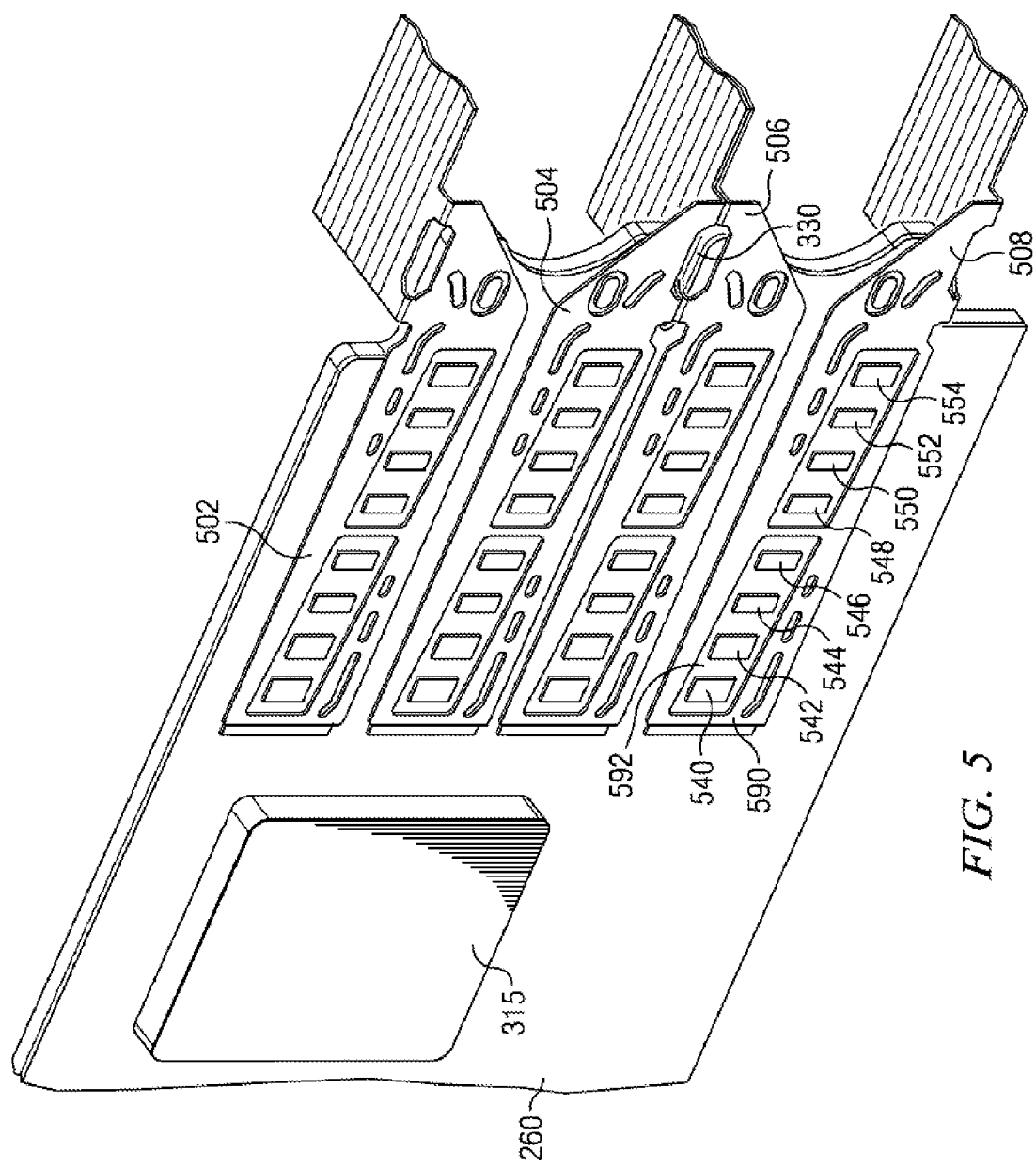
FIG. 5 is a perspective view of a plurality of flexure tail terminal regions attached to the FPC of FIG. 3, according to an embodiment of the present invention.

FIG. 5 is a perspective view of the terminal regions of a plurality of flexure tails 502, 504, 506, 508 attached to the FPC 260 of FIG. 3, according to an embodiment of the present invention. An intermediate region of each flexure tail 502, 504, 506, 508 may extend into one of the slits 310, 330, 340. Note that in the example embodiment of FIG. 5, each of the flexure tails 502, 504, 506, 508 is bent near a corresponding slit so that each of the flexure tail terminal regions is substantially orthogonal to the intermediate region of the same flexure tail. In the embodiment of FIG. 4, such bending may be facilitated by an optional opening (e.g. opening 493) that locally weakens the structural layer 410.

Now referring again to FIG. 5, the widened regions of the traces of the conductive layer of the flexure tails 502, 504, 506, 508 are not visible in the terminal regions because they are disposed on the side of the flexure tail terminal regions that is facing away from the viewer (and towards the FPC bond pads 380, 390 to which they are bonded). Rather, discontinuous islands in the structural layer of the flexure tails 502, 504, 506, 508 are visible in FIG. 5, because they are facing the viewer.

Note that in the embodiment of FIG. 5 the discontinuous islands do not all have the same island width. For example, the island width of each of the discontinuous islands 540, 542, and 554 of the flexure tail 508, is greater than the island width of each of the discontinuous islands 544, 546, 548, 550, 552 of the flexure tail 508. The structural layer in the terminal region of flexure tail 508 includes a peripheral frame 590 that defines and surrounds a structural layer window 592. As shown in FIG. 5, the discontinuous islands 540, 542, 544, and 546 are disposed within the structural layer window 592. The FPC 260 is shown in FIG. 5 to include pre-amplifier chip 315.

Figure 6A:
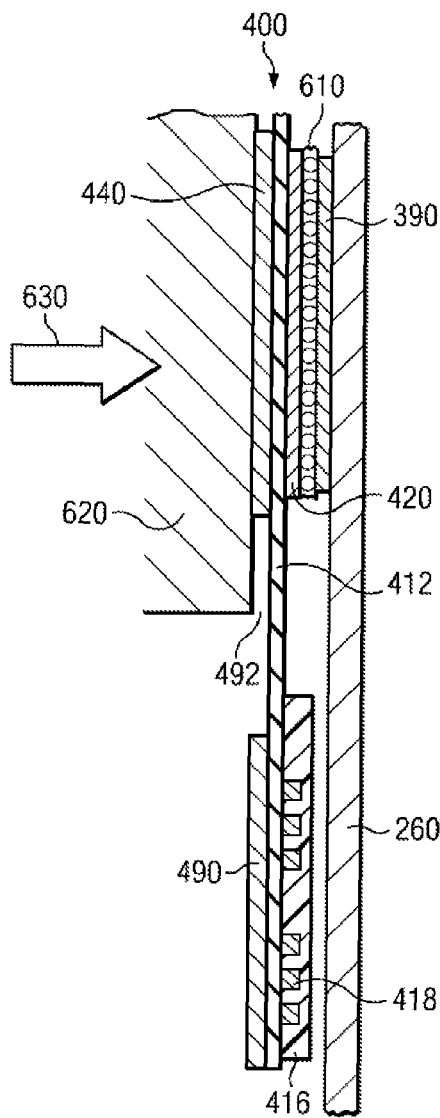
FIG. 6A depicts the bonding of a flexure bond pad to a corresponding flexible printed circuit bond pad by an anisotropic conductive film, according to an embodiment of the present invention.
Figure 6B:
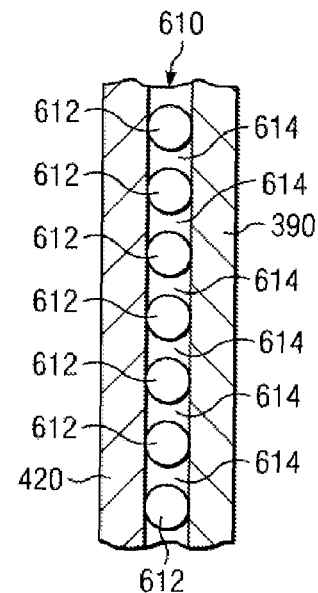
FIG. 6B is an expanded view of a portion of FIG. 6A.

In certain embodiments, each of the flexure bond pads may be bonded to a corresponding one of the plurality of FPC bond pads 380, 390 by an anisotropic conductive film (ACF). For example, FIGS. 6A-B depict the bonding of a widened region 420 to a corresponding FPC bond pad 390 by an ACF 610. Now referring to FIGS. 3, 4, 6A, and 6B, a thermode tool 620 may be brought into contact with a plurality of discontinuous islands (e.g. including discontinuous island 440) in the structural layer 410, to press the widened region 420 against the FPC bond pad 390 for a period.

As shown in FIG. 6B, the ACF 610 may comprise an adhesive material 614 that includes a plurality of electrically conductive beads 612 of substantially similar diameter. In certain embodiments the ACF 610 may employ beads of non-spherical shape, such as cylindrical beads or needle shaped beads. In certain embodiments the adhesive material 614 may be deposited on to the FPC bond pad 390 prior to aligning the widened region 420 therewith. Alternatively, the adhesive material 614 may be deposited on a first side of the widened region 420 (e.g. facing the FPC bond pad 390) prior to bringing the thermode tool 620 into contact with an opposing second side of the discontinuous island 440 (facing the thermode tool 620).

As shown in FIGS. 6A-B, the force 630 that presses (via the thermode tool 620) the flexure bond pads against the FPC bond pads during the period of bonding, may arrange the plurality of electrically conductive beads 612 in a monolayer. Each of the plurality of electrically conductive beads 612 in the monolayer may be in electrical contact with both the widened region 420 and the corresponding FPC bond pad 390. The thermode tool 620 may also transfer heat through the discontinuous island 440 and the widened region 420 during the period of bonding, and raise the temperature of the adhesive material 614 during such period, for example to accelerate curing of the adhesive material 614.

In certain embodiments, the force 630 of the thermode tool 620 is sufficient to cause the electrically conductive beads 612 to be substantially elastically deformed in compression between the widened region 420 and the corresponding FPC bond pad 390 during the period of thermal curing of the adhesive material 614. After the thermode tool 620 is removed, the electrically conductive beads 612 cool (with the cured adhesive) from an elevated curing temperature. Such cooling causes the electrically conductive beads 612 to shrink relative to their expanded size during thermal curing of the adhesive material 614.

However, the force 630 is preferably chosen to be great enough that the post-curing shrinkage of the electrically conductive beads 612 cannot completely relieve the compressive deformation of the electrically conductive beads 612 that was experienced during curing. Hence, after curing of the adhesive material 614, and after removal of the thermode tool 620, the electrically conductive beads 612 may remain in compression (and somewhat compressively deformed) between the widened region 420 and the corresponding FPC bond pad 390.

Although residual compression of the electrically conductive beads 612 may correspond to some residual tension in the cured adhesive material 614, the such residual compression of the electrically conductive beads 612 may be desirable to enhance and ensure reliable electrical conductivity of the ACF 610. For example, in the case where the electrically conductive beads 612 are spherical, the residual compression may cause small flat spots where the electrically conductive beads 612 contact the widened region 420 and the corresponding FPC bond pad 390. Such flat spots can provide finite contact areas rather than point contacts, which may desirably reduce the electrical resistance of the ACF 610.

To help facilitate higher volume manufacturing, the thermode tool 630 may include a flat surface that is substantially larger than any of the plurality of discontinuous islands in the structural layer 410, for example, so that many widened regions of the conductive layer 414 may be subjected to the applied pressure and heat transfer simultaneously. The localized flexure tail thickness increases at the location of the widened regions, that result from the discontinuous islands in the flexure tail terminal region 400 as shown and described previously with reference to FIG. 4, may advantageously allow a large flat thermode tool (e.g. thermode tool 620) to provide pressure and heat only to the widened region locations—without a need to first pattern or precisely align the thermode tool 620. This may advantageously simplify high volume manufacture. That is, in certain embodiments of the present invention, the local thickness variations of the flexure tail 400 due to the discontinuous islands, may act as a self-aligning pattern to augment and assist the thermode tool to selectively apply pressure and heat more to desired widened region locations of the flexure tail terminal region 400 than to undesired locations (e.g. locations away from the widened regions).

Figure 7:
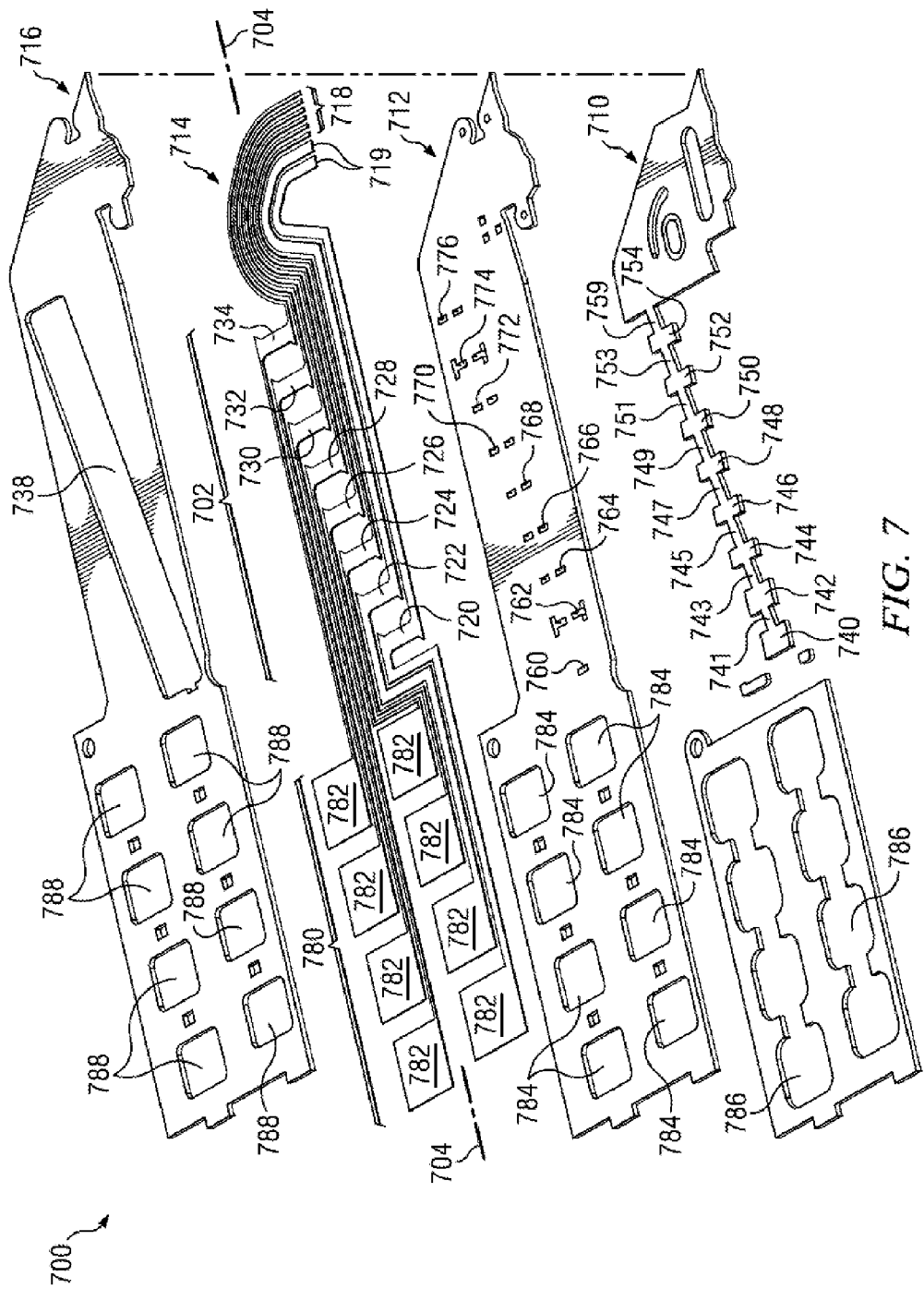
FIG. 7 is an exploded perspective view of a flexure tail terminal region, according to another embodiment of the present invention.

FIG. 7 is an exploded perspective view of a terminal region of a flexure tail 700, according to another embodiment of the present invention. The flexure tail 700 comprises a structural layer 710, a dielectric layer 712, a conductive layer 714, and an optional cover layer 716. In certain embodiments, the structural layer 710 comprises stainless steel, the dielectric layer 712 comprises polyimide, the conductive layer 714 comprises copper, and the cover layer comprises an insulative polymer, for example, though it is contemplated that other materials providing similar function might be used instead.

In the embodiment of FIG. 7, the conductive layer 714 of the flexure tail 700 includes six electrical traces 718 and two electrical traces 719. Each of the electrical traces 718 includes a corresponding one of a plurality of widened regions 724, 726, 728, 730, 732, 734 in a non-disposable region 702 to be bonded to the FPC (e.g. FPC 260 shown in FIG. 3). In this context, "widened" means wider than the width of a trace 718 in an intermediate region where the flexure tail 700 runs along the arm (i.e. the width of a trace 718 at the right side of FIG. 7). Likewise, each of the electrical traces 719 includes a corresponding one of a plurality of widened regions 420, 422, 434, in the non-disposable region 402 to be bonded to the FPC (e.g. FPC 260 shown in FIG. 3). In this context, "widened" means wider than the width of a trace 719 in the intermediate region where the flexure tail 700 runs along the arm (i.e. the width of a trace 719 at the right side of FIG. 7).

Note that in the embodiment of FIG. 7, the traces 719 are wider in the intermediate region than the traces 718. For example, in certain embodiments, those traces 719 may connect through to an inductive write element of a read/write head and may be wider than those traces 718 that connect through to a magetoresistive read element of the read/write head. However, others of the traces 718 may connect to other subcomponents of the read/write head or HGA (e.g. micro-actuator, transducer heater, electronic lapping guide, etc), instead of to only the magneto-resistive read element.

For example, in the embodiment of FIG. 7, each of the traces 719 may define a first trace width in the range 80 microns to 230 microns, and each of the traces 718 may define a second trace width in the range 20 microns to 50 microns. Alternatively, if more than one trace 718, 719 is attached to a single widened region 720, 722, 724, 726, 728, 730, 732, or 734, then the first trace width may be considered as the sum of the widths of the attached traces, and may be in the range 80 microns to 230 microns. Each of the plurality of widened regions 720, 722, 724, 726, 728, 730, 732, 734 may be preferably aligned with a corresponding one of the plurality of FPC bond pads 380, 390 shown in FIG. 3.

As shown in FIG. 7, each of the widened regions 720, 722, 724, 726, 728, 730, 732, 734 may extend further transverse to the flexure tail longitudinal axis 704 than it extends parallel to the flexure tail longitudinal axis 704. In certain embodiments, such inequality may render the widened regions to be relatively less sensitive to transverse misalignment with the corresponding FPC bond pad 380. Such transverse misalignment during disk drive assembly may be caused by FPC position variability (e.g. due to alignment pin to hole clearance), and/or undesired movement of the flexure tail by a manufacturing employee. Note that, during disk drive assembly, a manufacturing employee may more easily misalign the terminal region of the flexure tail 700 transverse to the flexure tail longitudinal axis 704 than parallel to the flexure tail longitudinal axis 704, since the flexure is difficult to stretch, and so moves more easily in the transverse direction.

The embodiment of FIG. 7 also includes a plurality of segments 740, 742, 744, 746, 748, 750, 752, 754 in the structural layer 710. As can be seen in FIG. 7, each of the segments 740, 742, 744, 746, 748, 750, 752, 754 in the structural layer 710 is connected to another by one or more of a plurality of narrow bridges 741, 743, 745, 747, 749, 751, 753 in the structural layer 710. In the embodiment of FIG. 7, successive connections by the plurality of narrow bridges of the plurality of segments form a fishbone shape in the structural layer 710. The entire fishbone shape may not be connected to the rest of the structural layer 710; that is, the connection 759 may be absent in certain embodiments.

In the embodiment of FIG. 7, the segments 740, 742, 744, 746, 748, 750, 752, 754 in the structural layer 710 are disposed in general alignment with corresponding widened regions 720, 722, 724, 726, 728, 730, 732, 734 in the conductive layer 714. For example, segment 740 is disposed in general alignment with widened region 720. In the embodiment of FIG. 7, each widened region 720, 722, 724, 726, 728, 730, 732, 734, along with the corresponding structural layer segment 740, 742, 744, 746, 748, 750, 752, 754 with which it is aligned, defines a flexure bond pad or flexure bond pad location. Preferably but not necessarily, each of the plurality of narrow bridges 741, 743, 745, 747, 749, 751, 753 in the structural layer 710 is oriented substantially parallel to the flexure tail longitudinal axis 704 (e.g. within ±10° of being perfectly parallel).

In the embodiment of FIG. 7, the segments in the structural layer 710 preferably increase the thickness of the flexure tail terminal region 700 at the locations of the flexure bond pads (e.g. at the location of the widened region 724). For example, the thickness of the structural layer may be preferably less than 20 microns, the thickness of the dielectric layer may be preferably less than 15 microns, the thickness of the conductive layer may be preferably less than 15 microns, while a total thickness of the flexure tail terminal region 700 at the flexure bond pads is preferably at least 25 microns. Such inequalities may enhance the utility of a non-patterned thermode tool to apply more uniform heat and pressure to the flexure bond pads during bonding.

In the embodiment of FIG. 7, each of the widened regions 720, 722, 724, 726, 728, 730, 732, 734 defines a widened region width that is measured parallel to the longitudinal axis 704 of the terminal region of the flexure tail 700. For example, the widened region width may be in the range 90 to 230 microns. Likewise, each of the plurality of segments 740, 742, 744, 746, 748, 750, 752, 754 defines a segment width that is measured parallel to the flexure tail longitudinal axis 704. Specifically, in the embodiment of FIG. 7, the plurality of segments 740, 742, 744, 746, 748, 750, 752, 754 includes six segments 744, 746, 748, 750, 752, and 754, each having a segment width that is not greater than the widened region width of widened regions 724, 726, 728, 730, 732, 734, respectively. By contrast, however, the plurality of segments 740, 742, 744, 746, 748, 750, 752, 754 also includes two segments 740, 742, each having a segment width that is in the range 1.1 to 2 times the widened region width of widened regions 720, 722, respectively.

Hence, in the embodiment of FIG. 7, the segment width of the two segments 740, 742, are each greater than the segment widths of the six segments 744, 746, 748, 750, 752, and 754. The foregoing inequalities may enable the terminal region of the flexure tail 700 to desirably allow a greater amount of heat to pass through each of the two segments 740, 742 (for bonding of the widened regions 720, 722), than through each of the six segments 744, 746, 748, 750, 752, and 754 (for bonding of the widened regions 724, 726, 728, 730, 732, 734). The relatively greater heat flow through the segments 740, 742 may help maintain a more uniform temperature among the plurality of widened regions 720, 722, 724, 726, 728, 730, 732, 734 during bonding, because each of the two wider electrical traces 719 may conduct away more applied heat during bonding than each of the six narrower electrical traces 718.

In the embodiment of FIG. 7, the dielectric layer 712 electrically insulates the conductive traces 718 of the conductive layer 714 from the structural layer 710. Such electrical insulation may be desired because the structural layer 710 may be electrically conductive (e.g. stainless steel), and so otherwise the structural layer 710 may cause an electrical short between the traces 718 and/or from the traces 718 to ground. In the embodiment of FIG. 7, the dielectric layer 712 optionally includes a plurality of through openings 760, 762, 764, 766, 768, 770, 772, 774, 776. Each of the plurality of the openings 760, 762, 764, 766, 768, 770, 772, 774, 776 through the dielectric layer 712 may be disposed adjacent, but preferably not overlying, at least one of the plurality of structural layer segments 740, 742, 744, 746, 748, 750, 752, 754 in the structural layer 710. In certain embodiments, the openings 760, 762, 764, 766, 768, 770, 772, 774, 776 through the dielectric layer 712 may serve an adhesive control purpose (e.g. to limit the spread of adhesive used during the flexure tail bonding process).

In the embodiment of FIG. 7, the flexure tail terminal region 700 optionally includes a disposable test pad region 780. Before the flexure tail terminal region 700 is bonded to an FPC (e.g. FPC 260 shown in FIG. 3), a plurality of test pads 782 in the conductive layer 714 may facilitate HGA testing. During HGA electrical testing, one or more test probes may contact the test pads 782. In the embodiment of FIG. 7, openings 788 through the cover layer 716, openings 784 through the dielectric layer 712, and openings 786 through the structural layer 710, may facilitate contact by the probes from either side of the test pads 782. After HGA testing, and before the bond pads of the flexure tail 700 are bonded to the FPC (e.g. FPC 260 shown in FIG. 3), all layers of the disposable test pad region 780 are preferably cut away from the flexure tail 700, so that only the non-disposable region 702 remains.

In the embodiment of FIG. 7, the cover layer 716 includes a cover layer window 738 that spans the plurality of flexure bond pads parallel to the flexure tail longitudinal axis 704, and that spans the plurality of flexure bond pads transverse to the flexure tail longitudinal axis 704. Such a cover layer window 738 may permit bonding access to the widened regions 720, 722, 724, 726, 728, 730, 732, 734 of the conductive layer 714, while advantageously covering some other regions of the electrical traces 718 that are not to be bonded. This optional feature of the flexure tail 700 may improve handling robustness of the HGA during manufacture.

Figure 8:
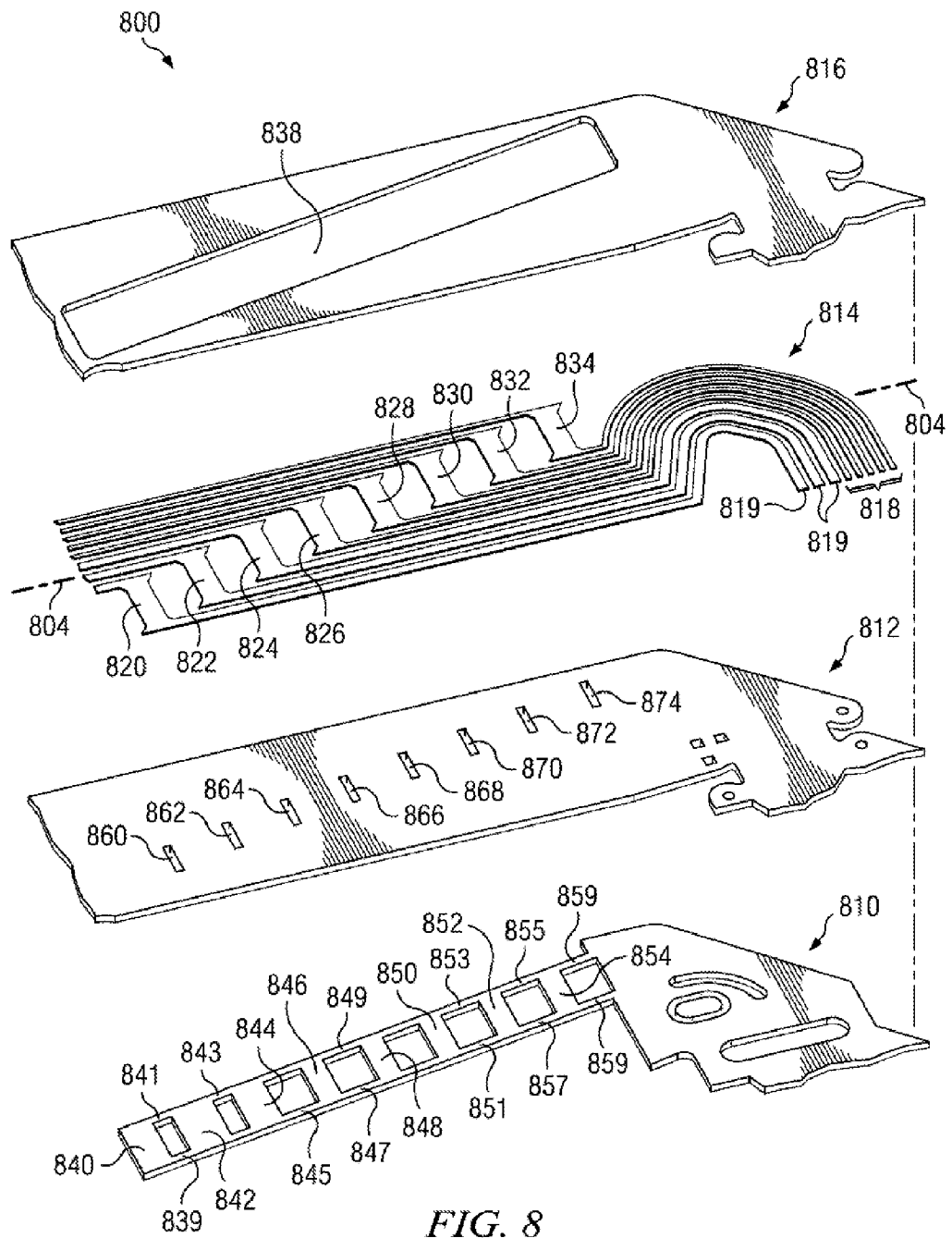
FIG. 8 is an exploded perspective view of a flexure tail terminal region, according to another embodiment of the present invention.

FIG. 8 is an exploded perspective view of a terminal region of a flexure tail 800, according to another embodiment of the present invention. The flexure tail 800 comprises a structural layer 810, a dielectric layer 812, a conductive layer 814, and an optional cover layer 816. In certain embodiments, the structural layer 810 comprises stainless steel, the dielectric layer 812 comprises polyimide, the conductive layer 814 comprises copper, and the cover layer comprises an insulative polymer, for example, though it is contemplated that other materials providing similar function might be used instead.

In the embodiment of FIG. 8, the conductive layer 814 of the flexure tail 800 includes five electrical traces 818 and three electrical traces 819. Each of the electrical traces 818 includes a corresponding one of a plurality of widened regions 826, 828, 830, 832, 834. In this context, "widened" means wider than the width of a trace 818 in an intermediate region where the flexure tail 800 runs along the arm (i.e. the width of a trace 818 at the right side of FIG. 8). Likewise, each of the electrical traces 819 includes a corresponding one of a plurality of widened regions 820, 822, 824. In this context, "widened" means wider than the width of a trace 819 in the intermediate region where the flexure tail 800 runs along the arm (i.e. the width of a trace 819 at the right side of FIG. 8).

Note that in the embodiment of FIG. 8, the traces 819 are wider in the intermediate region than the traces 818. For example, in certain embodiments, those traces 819 that connect through to an inductive write element of a read/write head may be wider than those traces 818 that connect through to a magetoresistive read element of the read/write head. However, others of the traces 818 and/or others of the traces 819 may connect to other subcomponents of the read/write head or HGA (e.g. microactuator, transducer heater, electronic lapping guide, etc), instead of to only an inductive writer or magneto-resistive read element.

For example, in the embodiment of FIG. 8, each of the traces 819 may define a first trace width in the range 80 microns to 230 microns, and each of the traces 818 may define a second trace width in the range 20 microns to 50 microns. Alternatively, if more than one trace 818, 819 is attached to a single widened region 820, 822, 824, 826, 828, 830, 832, or 834, then the first trace width may be considered as the sum of the widths of the attached traces, and may be in the range 80 microns to 230 microns. Each of the plurality of widened regions 820, 822, 824, 826, 828, 830, 832, 834 may be preferably aligned with a corresponding one of the plurality of FPC bond pads 380, 390 shown in FIG. 3.

As shown in FIG. 8, each of the widened regions 820, 822, 824, 826, 828, 830, 832, 834 may extend further transverse to the flexure tail longitudinal axis 804 than it extends parallel to the flexure tail longitudinal axis 804. In certain embodiments, such inequality may render the widened regions to be relatively less sensitive to transverse misalignment with the corresponding FPC bond pad 380. Such transverse misalignment during disk drive assembly may be caused by FPC position variability (e.g. due to alignment pin to hole clearance), and/or undesired movement of the flexure tail by a manufacturing employee. Note that, during disk drive assembly, a manufacturing employee may more easily misalign the terminal region of the flexure tail 800 transverse to the flexure tail longitudinal axis 804 than parallel to the flexure tail longitudinal axis 804, since the flexure is difficult to stretch, and so moves more easily in the transverse direction.

The embodiment of FIG. 8 also includes a plurality of segments 840, 842, 844, 846, 848, 850, 852, 854 in the structural layer 810. As can be seen in FIG. 8, each of the segments 840, 842, 844, 846, 848, 850, 852, 854 in the structural layer 810 is connected to another by two of a plurality of narrow bridges (e.g. narrow bridges 839, 841, 843, 845, 847, 849, 851, 853, 855, 857 in the structural layer 810. In the embodiment of FIG. 8, successive connections by the plurality of narrow bridges of the plurality of segments form a ladder shape in the structural layer 810. The entire ladder shape may not be connected to the rest of the structural layer 810; that is, the connections 859 may be absent in certain embodiments.

In the embodiment of FIG. 8, the segments 840, 842, 844, 846, 848, 850, 852, 854 in the structural layer 810 are disposed in general alignment with corresponding widened regions 820, 822, 824, 826, 828, 830, 832, 834 in the conductive layer 814. For example, segment 840 is disposed in general alignment with widened region 820. In the embodiment of FIG. 8, each widened region 820, 822, 824, 826, 828, 830, 832, 834, along with the corresponding structural layer segment 840, 842, 844, 846, 848, 850, 852, 854 with which it is aligned, defines a flexure bond pad or flexure bond pad location. Preferably but not necessarily, each of the plurality of narrow bridges 839, 841, 843, 845, 847, 849, 851, 853, 855, 857 in the structural layer 810 is oriented substantially parallel to the flexure tail longitudinal axis 804 (e.g. within ±10° of being perfectly parallel).

In the embodiment of FIG. 8, the segments in the structural layer 810 preferably increase the thickness of the flexure tail terminal region 800 at the locations of the flexure bond pads (e.g. at the location of the widened region 822). For example, the thickness of the structural layer may be preferably less than 20 microns, the thickness of the dielectric layer may be preferably less than 15 microns, the thickness of the conductive layer may be preferably less than 15 microns, while a total thickness of the flexure tail terminal region 800 at the flexure bond pads is preferably at least 25 microns. Such inequalities may enhance the utility of a non-patterned thermode tool to apply more uniform heat and pressure to the flexure bond pads during bonding.

In the embodiment of FIG. 8, each of the widened regions 820, 822, 824, 826, 828, 830, 832, 834 defines a widened region width that is measured parallel to the flexure tail longitudinal axis 804. Likewise, each of the plurality of structural layer segments 840, 842, 844, 846, 848, 850, 852, 854 defines a segment width that is measured parallel to the flexure tail longitudinal axis 804. Preferably, the widened region width is no greater than but at least 80% of the segment width. Such inequality may enhance the uniformity of the heat and pressure transferred from the thermode tool through the discontinuous islands to the widened regions during bonding.

In the embodiment of FIG. 8, each of the widened regions 820, 822, 824, 826, 828, 830, 832, 834 defines a widened region width that is measured parallel to the longitudinal axis 804 of the terminal region of the flexure tail 800. For example, the widened region width may be in the range 90 to 230 microns. Likewise, each of the plurality of segments 840, 842, 844, 846, 848, 850, 852, 854 defines a segment width that is measured parallel to the flexure tail longitudinal axis 804. Specifically, in the embodiment of FIG. 8, the plurality of segments 840, 842, 844, 846, 848, 850, 852, 854 includes five segments 846, 848, 850, 852, and 854, each having a segment width that is not greater than the widened region width of widened regions 826, 828, 830, 832, 834, respectively. By contrast, however, the plurality of segments 840, 842, 844, 846, 848, 850, 852, 854 also includes three segments 840, 842, 844 each having a segment width that is in the range 1.1 to 2 times the widened region width of widened regions 820, 822, 824 respectively.

Hence, in the embodiment of FIG. 8, the segment width of the three segments 840, 842, 844 are each greater than the segment widths of the five segments 846, 848, 850, 852, and 854. The foregoing inequalities may enable the terminal region of the flexure tail 800 to desirably allow a greater amount of heat to pass through each of the three segments 840, 842, 844 (for bonding of the widened regions 820, 822, 824), than through each of the five segments 846, 848, 850, 852, and 854 (for bonding of the widened regions 826, 828, 830, 832, 834). The relatively greater heat flow through the segments 840, 842, 844 may help maintain a more uniform temperature among the plurality of widened regions 820, 822, 824, 826, 828, 830, 832, 834 during bonding, because each of the three wider electrical traces 819 may conduct away more applied heat during bonding than each of the five narrower electrical traces 818.

In the embodiment of FIG. 8, the dielectric layer 812 electrically insulates the conductive traces 818 of the conductive layer 814 from the structural layer 810. Such electrical insulation may be desired because the structural layer 810 may be electrically conductive (e.g. stainless steel), and so otherwise the structural layer 810 may cause an electrical short between the traces 818 and/or from the traces 818 to ground. In the embodiment of FIG. 8, the dielectric layer 812 optionally includes a plurality of through openings 860, 862, 864, 866, 868, 870, 872, 874. Each of the plurality of the openings 860, 862, 864, 866, 868, 870, 872, 874 through the dielectric layer 812 may be disposed adjacent, but preferably not overlying, at least one of the plurality of structural layer segments 840, 842, 844, 846, 848, 850, 852, 854 in the structural layer 810. In certain embodiments, the openings 860, 862, 864, 866, 868, 870, 872, 874 through the dielectric layer 812 may serve an adhesive control purpose (e.g. to limit the spread of adhesive used during the flexure tail bonding process).

In the embodiment of FIG. 8, the cover layer 816 includes a cover layer window 838 that spans the plurality of flexure bond pads parallel to the flexure tail longitudinal axis 804, and that spans the plurality of flexure bond pads transverse to the flexure tail longitudinal axis 804. Such a cover layer window 838 may permit bonding access to the widened regions 820, 822, 824, 826, 828, 830, 832, 834 of the conductive layer 814, while advantageously covering some other regions of the electrical traces 818 that are not to be bonded. This optional feature of the flexure tail 800 may improve handling robustness of the HGA during manufacture.

Figure 9:
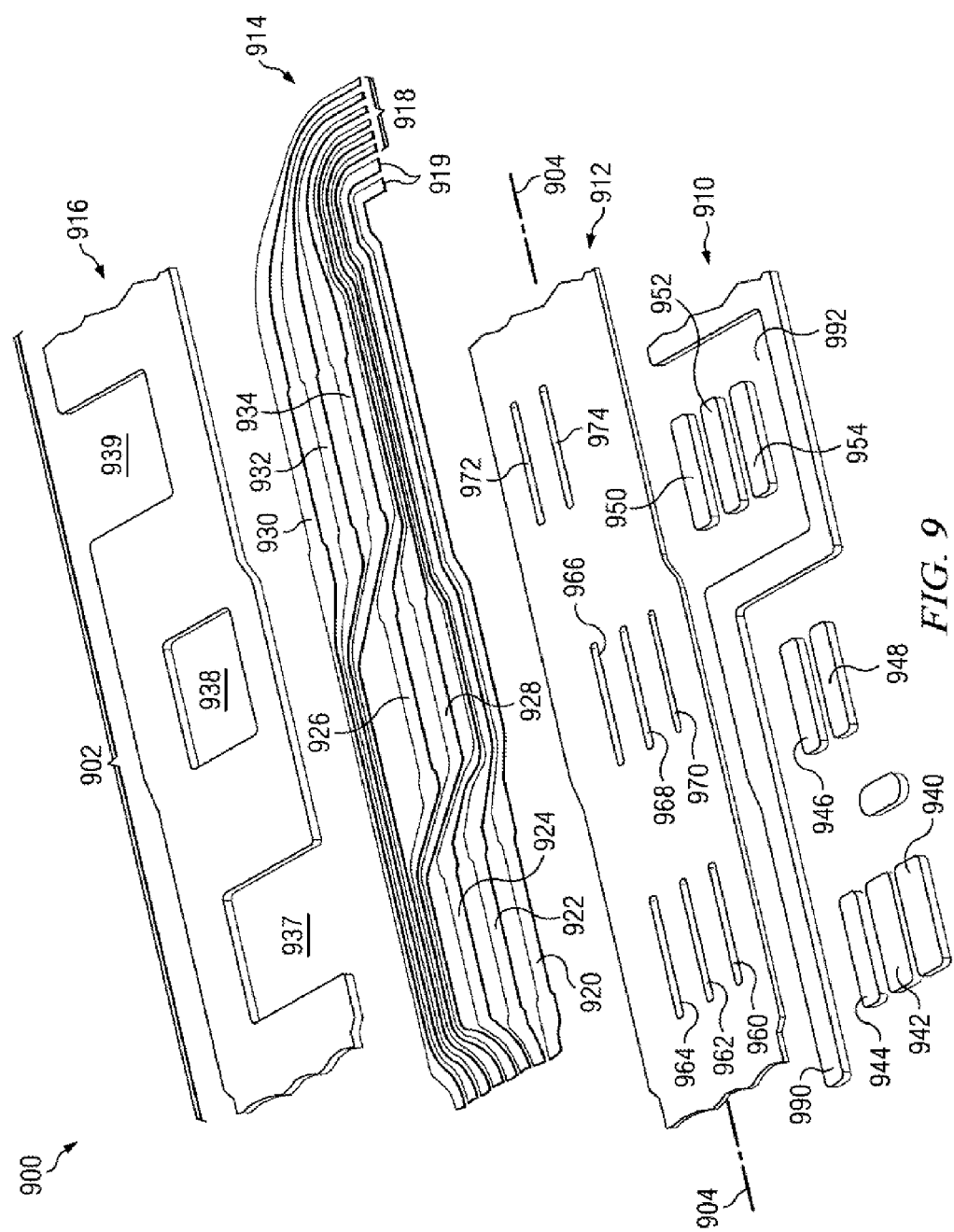
FIG. 9 is an exploded perspective view of a flexure tail terminal region, according to another embodiment of the present invention.

FIG. 9 is an exploded perspective view of a terminal region of a flexure tail 900, according to an embodiment of the present invention. The flexure tail 900 of the laminate flexure comprises a structural layer 910, a dielectric layer 912, a conductive layer 914, and a cover layer 916. In certain embodiments, the structural layer 910 comprises stainless steel, the dielectric layer 912 comprises polyimide, the conductive layer 914 comprises copper, and the cover layer comprises an insulative polymer, for example, though it is contemplated that other materials providing similar function might be used instead.

In the embodiment of FIG. 9, the conductive layer 914 of the flexure tail 900 includes six electrical traces 918 and two electrical traces 919, although a different number of electrical traces might be employed in any of the embodiments described herein. Each of the electrical traces 918 includes a corresponding one of a plurality of widened regions 924, 926, 928, 930, 932, 934. In this context, "widened" means wider than the width of a trace 918 in an intermediate region where the flexure tail 900 runs along the arm (i.e. the width of a trace 918 at the right side of FIG. 9). Likewise, each of the electrical traces 919 includes a corresponding one of a plurality of widened regions 920, 922. In this context, "widened" means wider than the width of a trace 919 in the intermediate region where the flexure tail 900 runs along the arm (i.e. the width of a trace 919 at the right side of FIG. 9).

Note that in the embodiment of FIG. 9, the traces 919 are wider in the intermediate region than the traces 918. For example, in certain embodiments, the traces 919 may connect through to an inductive write element of a read/write head and may be wider than those traces 918 that connect through to a magetoresistive read element of the read/write head. However, others of the traces 918 may connect to other subcomponents of the read/write head or HGA (e.g. microactuator, transducer heater, electronic lapping guide, etc), instead of to only the magneto-resistive read element.

For example, in the embodiment of FIG. 9, each of the traces 919 may define a first trace width in the range 80 microns to 230 microns, and each of the traces 918 may define a second trace width in the range 20 microns to 50 microns. Alternatively, if more than one trace 918, 919 is attached to a single widened region 920, 922, 924, 926, 928, 930, 932, or 934, then the first trace width may be considered as the sum of the widths of the attached traces, and may be in the range 80 microns to 230 microns. Each of the plurality of widened regions 920, 922, 924, 926, 928, 930, 932, 934 may be preferably aligned with a corresponding one of the plurality of FPC bond pads.

As shown in FIG. 9, each of the widened regions 920, 922, 924, 926, 928, 930, 932, 934 may extend further parallel to the flexure tail longitudinal axis 904 than it extends transverse to the flexure tail longitudinal axis 904. In certain embodiments, such inequality may render the widened regions to be relatively less sensitive to axial misalignment with the corresponding FPC bond pad. Such axial misalignment during disk drive assembly may be caused by FPC position variability (e.g. due to alignment pin to hole clearance), and/or rotational positioning variability of the head gimbal assembly about its swage axis (e.g. that may result from the swaging process), and/or variability in flexure tail routing through positioning features along the actuator arm (e.g. due to clearance between the flexure tail and a positioning groove that may run along an edge of the actuator arm), and/or variation in the position of the actuator arm tip along the swaging axis.

Also in the embodiment of FIG. 9, a plurality of discontinuous islands 940, 942, 944, 946, 948, 950, 952, 954 are defined in the structural layer 910 and are disposed in general alignment with corresponding widened regions in the conductive layer. For example, discontinuous island 940 is disposed in general alignment with widened region 920. In this context, an island in the structural layer 910 is considered to be discontinuous if it does not directly contact the rest of the structural layer 910, even if it is joined by a web or bridge in the dielectric layer 912 and/or the conductive layer 914. In the embodiment of FIG. 9, each widened region 920, 922, 924, 926, 928, 930, 932, 934, along with the corresponding discontinuous island 940, 942, 944, 946, 948, 950, 952, 954 with which it is aligned, defines a flexure bond pad or flexure bond pad location.

In the embodiment of FIG. 9, the structural layer 910 includes a peripheral frame 990 that defines and surrounds a structural layer window 992. As shown in FIG. 9, the discontinuous islands 950, 952, 954 are disposed within the structural layer window 992. The peripheral frame 990 underlies a region of the plurality of electrical traces 918 where the traces are relatively narrow. Although the structural layer window 992 has a broken and open inner contour 994 in the embodiment of FIG. 9, it may be a closed and continuous inner contour in certain alternative embodiments.

In the embodiment of FIG. 9, the discontinuous islands 940, 942, 944, 946, 948, 950, 952, 954 in the structural layer 910 preferably increase the thickness of the flexure tail terminal region 900 at the locations of the flexure bond pads (e.g. at the location of the widened region 922). For example, the thickness of the structural layer may be preferably less than 20 microns, the thickness of the dielectric layer may be preferably less than 15 microns, the thickness of the conductive layer may be preferably less than 15 microns, while a total thickness of the flexure tail terminal region 400 at the flexure bond pads is preferably at least 25 microns. Such inequalities may enhance the utility of a non-patterned thermode tool to apply more uniform heat and pressure to the flexure bond pads during bonding.

In the embodiment of FIG. 9, each of the widened regions 920, 922, 924, 926, 928, 930, 932, 934 defines a widened region width that is measured transverse to the flexure tail longitudinal axis 904. Likewise, each of the plurality of discontinuous islands 940, 942, 944, 946, 948, 950, 952, 954 defines an island width that is measured transverse to the flexure tail longitudinal axis 904. Preferably, the widened region width is no greater than but at least 80% of the island width. Such inequality may enhance the uniformity of the heat and pressure transferred from the thermode tool through the discontinuous islands to the widened regions during bonding.

In the embodiment of FIG. 9, each of the widened regions 920, 922, 924, 926, 928, 930, 932, 934 defines a widened region width that is measured transverse to the flexure tail longitudinal axis 904. For example, the widened region width may be in the range 90 to 230 microns. Likewise, each of the plurality of discontinuous islands 940, 942, 944, 946, 948, 950, 952, 954 defines an island width that is measured transverse to the flexure tail longitudinal axis 904. Specifically, in the embodiment of FIG. 9, the plurality of discontinuous islands 940, 942, 944, 946, 948, 950, 952, 954 includes six discontinuous islands 944, 946, 948, 950, 952, and 954, each having an island width that is not greater than the widened region width of widened regions 924, 926, 928, 930, 932, 934, respectively. By contrast, however, the plurality of discontinuous islands 940, 942, 944, 946, 948, 950, 952, 954 also includes two discontinuous islands 940, 942 each having an island width that is in the range 1.1 to 2 times the widened region width of widened regions 920, 922, respectively.

Hence, in the embodiment of FIG. 9, the island widths of the two discontinuous islands 940, 942, are each greater than the island widths of the six discontinuous islands 944, 946, 948, 950, 952, and 954. The foregoing inequalities may enable the terminal region of the flexure tail 900 to desirably allow a greater amount of heat to pass through each of the two discontinuous islands 940, 942 (for bonding of the widened regions 920, 922, and 934), than through each of the six discontinuous islands 944, 946, 948, 950, 952, and 954 (for bonding of the widened regions 924, 926, 928, 930, 932, 934). The relatively greater heat flow through the discontinuous islands 940, 942 may help maintain a more uniform temperature among the plurality of widened regions 920, 922, 924, 926, 928, 930, 932, 934 during bonding, because each of the two wider electrical traces 919 may conduct away more applied heat during bonding than each of the six narrower electrical traces 918.

In the embodiment of FIG. 9, the dielectric layer 912 electrically insulates the conductive traces 918 of the conductive layer 914 from the structural layer 910. Such electrical insulation may be desired because the structural layer 910 may be electrically conductive (e.g. stainless steel), and so otherwise the structural layer 910 may cause an electrical short between the traces 918, 919 and/or from the traces 918, 919 to ground. In the embodiment of FIG. 9, the dielectric layer 912 optionally includes a plurality of through openings 960, 962, 964, 966, 968, 970, 972, 974. Each of the plurality of the openings 960, 962, 964, 966, 968, 970, 972, 974 through the dielectric layer 912 may be disposed adjacent, but preferably not overlying, at least one of the plurality of discontinuous islands 940, 942, 944, 946, 948, 950, 952, 954 in the structural layer 910. In certain embodiments, the openings 960, 962, 964, 966, 968, 970, 972, 974 through the dielectric layer 912 may serve an adhesive control purpose (e.g. to limit the spread of adhesive used during the flexure tail bonding process).

In the embodiment of FIG. 9, the cover layer 916 includes three cover layer openings 937, 938, 939 that leave exposed the plurality of widened regions 920, 922, 924, 926, 928, 930, 932, 934. Such cover layer openings may permit bonding access to the widened regions 920, 922, 924, 926, 928, 930, 932, 934 of the conductive layer 914, while advantageously covering some other regions of the electrical traces 918 that are not to be bonded. This optional feature of the flexure tail 900 may improve handling robustness of the HGA during manufacture.

Figure 10A:
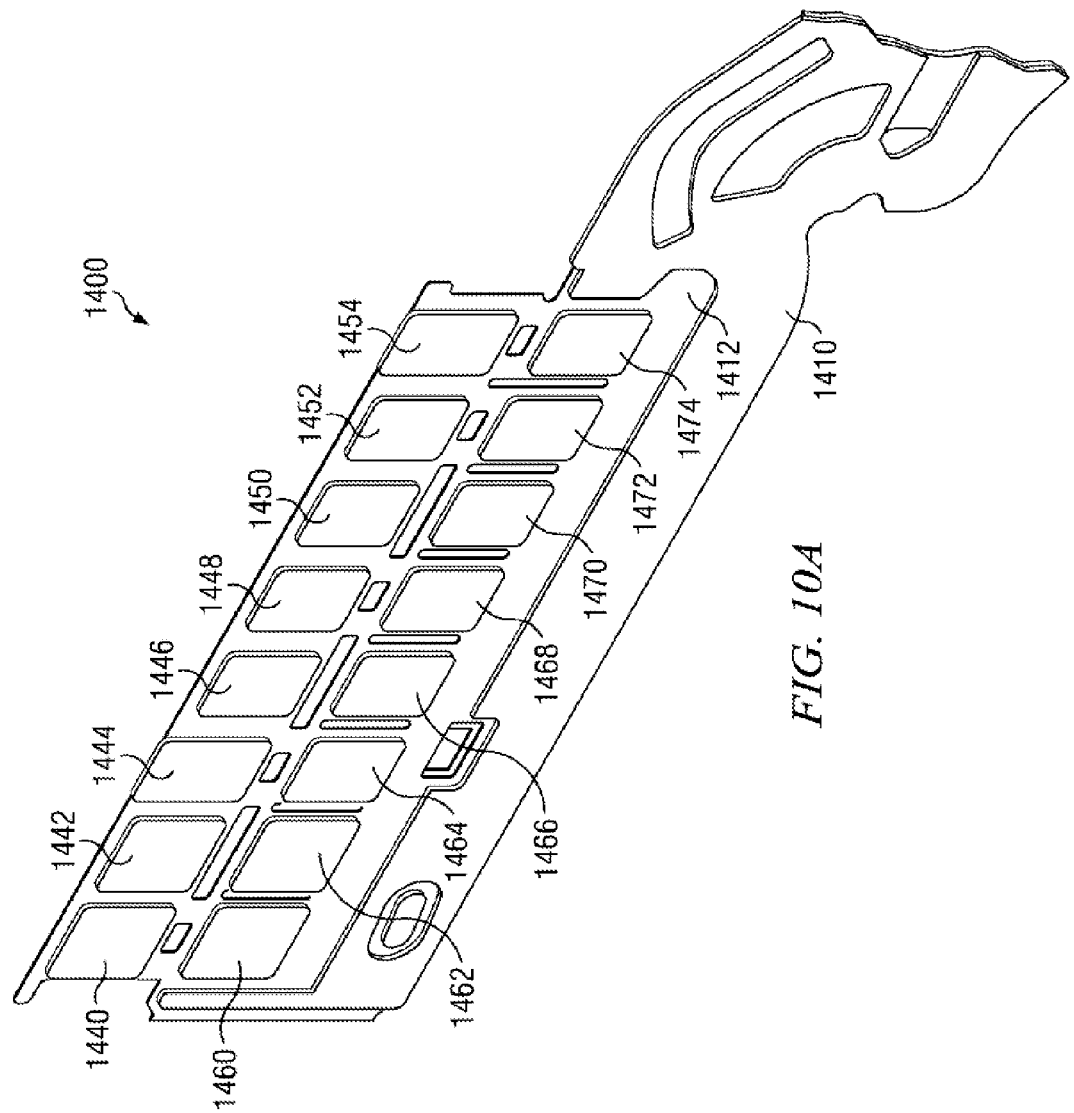
FIG. 10A depicts a flexure tail terminal region before folding, according to another embodiment of the present invention.
Figure 10C:
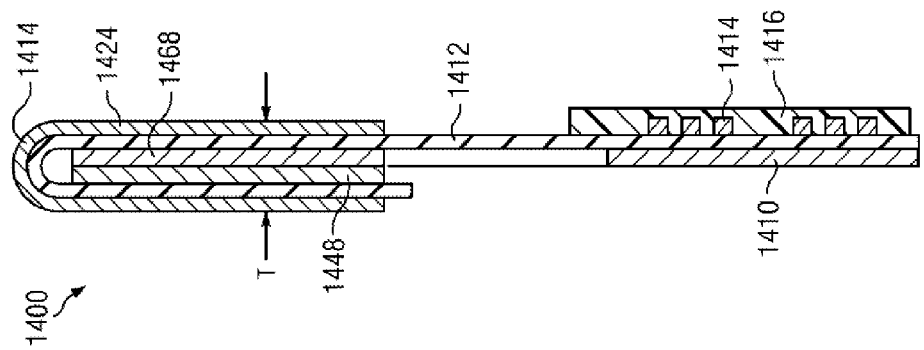
FIG. 10C depicts a cross-section of the folded flexure tail terminal region of FIG. 10B.
Figure 10B:
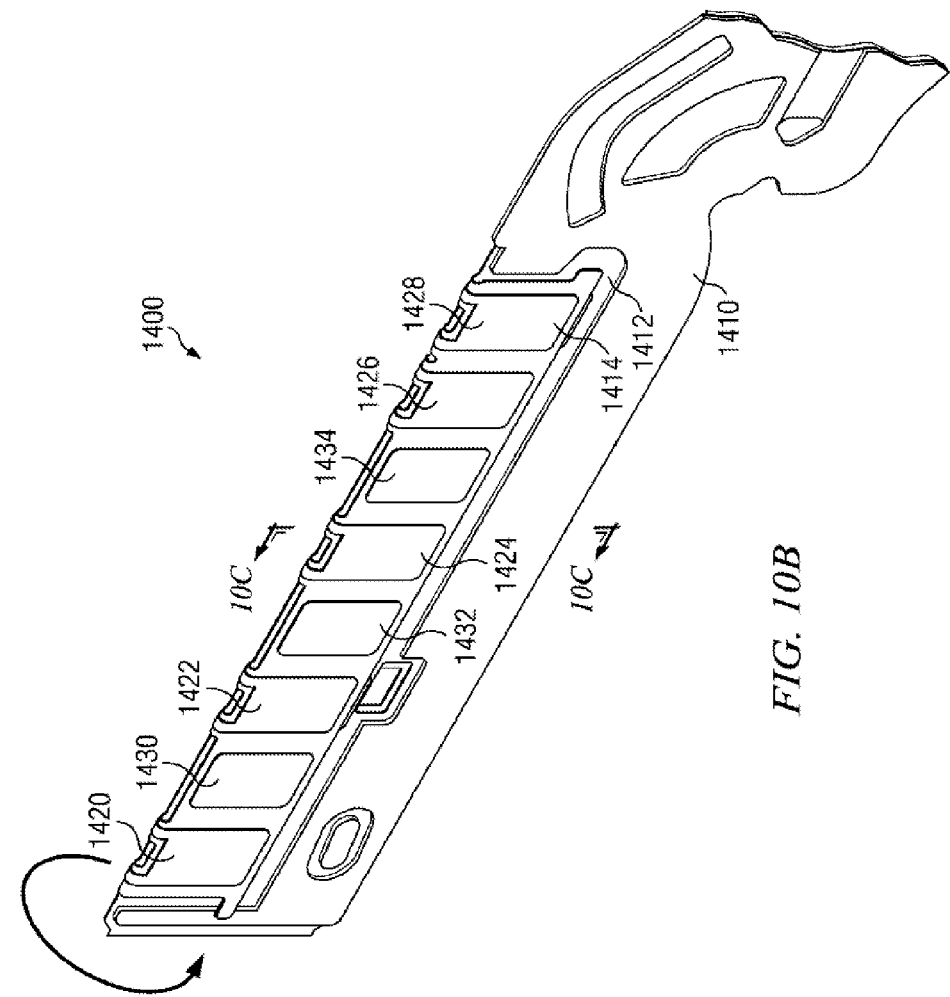
FIG. 10B depicts the flexure tail terminal region of FIG. 10A, except after folding.

FIG. 10A depicts a close up perspective view of a flexure tail terminal region 1400 of a laminate flexure, before its bond pads are folded upon themselves according to another example embodiment of the present invention. FIG. 10B shows the flexure tail terminal region 1400 after its bond pads are folded upon themselves, and FIG. 10C depicts a cross section of FIG. 10B. Now referring additionally to FIGS. 10A-C, the flexure tail terminal region 1400 of the laminate flexure comprises a structural layer 1410, a dielectric layer 1412, and a conductive layer 1414. In certain embodiments, the structural layer 1410 comprises stainless steel, the dielectric layer 1412 comprises polyimide, and the conductive layer 1414 comprises copper, for example, though it is contemplated that other materials providing similar function might be used instead. Certain embodiments optionally further comprise an insulative cover layer 1416 (e.g. a polymeric material), that covers and insulates portions of the conductive layer 1414.

The flexure tail terminal region 1400 includes a plurality of flexure bond pads 1420, 1422, 1424, 1426, 1428, each of which aligned with a corresponding one of the plurality of FPC bond pads after assembly. The flexure tail terminal region 1400 also includes flexure bond pads 1430, 1432, 1434, which are also aligned with corresponding ones of the plurality of FPC bond pads after assembly. Each of the plurality of flexure bond pads 1420, 1422, 1424, 1426, 1428, 1430, 1432, and 1434 is folded upon itself. In certain embodiments, folding each of the plurality of flexure bond pads 1420, 1422, 1424, 1426, 1428, 1430, 1432, and 1434 upon itself comprises simultaneously folding all of the plurality of flexure bond pads 1420, 1422, 1424, 1426, 1428, 1430, 1432, and 1434 by folding the terminal region 1400 of the flexure tail upon itself. In an alternative embodiment, one or more individual bond pads may be folded non-simultaneously with others. In certain embodiments of the present invention, the folding of the flexure tail terminal region 1400 at the bond pad locations may precede alignment with the FPC bond pads during assembly, whereas in other embodiments alignment with FPC bond pads may precede folding.

Before folding, the flexure bond pads 1420, 1422, 1424, 1426, 1428, 1430, 1432, and 1434 are not visible in FIG. 10A because they are disposed on the side of the flexure tail terminal region 1400 that is facing away from the viewer. After folding, portions of the flexure bond pads 1420, 1422, 1424, 1426, 1428, 1430, 1432, and 1434 are visible in FIG. 10B. In the case of flexure bond pads 1420, 1422, 1424, 1426, 1428, the portions depicted in FIG. 10B are shown to be electrically continuous with corresponding portions (on the side of the flexure tail terminal region 1400 that is facing away from the viewer) that would be electrically connected to the FPC bond pads after assembly. In the case of flexure bond pads 1430, 1432, and 1434, however, the portions depicted in FIG. 10B are shown to be electrically discontinuous with portions (on the side of the flexure tail terminal region 1400 that is facing away from the viewer) that would be electrically connected to the FPC bond pads.

In the embodiment of FIGS. 10A-C, a plurality of backing plates 1440, 1442, 1444, 1446, 1448, 1450, 1452, 1454, 1460, 1462, 1464, 1466, 1468, 1470, 1472, and 1474 are defined in the structural layer 1410 and are disposed in general alignment with corresponding flexure bonding pads. For example, a pair of backing plates 1440, 1460 are disposed in general alignment with bond pad 1420. Likewise, a pair of backing plates 1442, 1462 are disposed in general alignment with bond pad 1430. As shown best in FIG. 10C, upon folding, the two backing plates (e.g. 1448, 1468) of each backing plate pair may be brought into facing contact with each other to increase the thickness of the folded flexure tail terminal region 1400 at the locations of the bond pads (e.g. at the location of the flexure bond pad 1424).

For example, as shown in FIG. 10C, the laminate flexure may define a total folded thickness T at each of the plurality of flexure bond pads that is at twice a thickness of the structural layer, plus twice a thickness of the dielectric layer, plus twice a thickness of the conductive layer (or more, e.g. if surface irregularities, contaminates, and/or additional layers are present). For example, the thickness of the structural layer may be less than 20 microns, the thickness of the dielectric layer may be less than 15 microns, the thickness of the conductive layer may be less than 15 microns, and yet the total folded thickness T may be at least 60 microns.

Note that in the embodiment of FIG. 10A the backing plates 1440, 1442, 1444, 1446, 1448, 1450, 1452, 1454, 1460, 1462, 1464, 1466, 1468, 1470, 1472, and 1474 do not all have the same width measured parallel to the longitudinal axis of the terminal region of the flexure tail 1400. For example, the island width of each of the backing plates 1440, 1442, 1460, and 1462 of the flexure tail 1400, is greater than the island width of each of the backing plates 1444, 1446, 1448, 1450, 1452, 1454, 1464, 1466, 1468, 1470, 1472, and 1474 of the flexure tail 1400. The foregoing inequality may enable the terminal region of the flexure tail 1400 to desirably allow a greater amount of heat to pass through each of the backing plates 1440, 1442, 1460, and 1462, than through each of the backing plates 1444, 1446, 1448, 1450, 1452, 1454, 1464, 1466, 1468, 1470, 1472, and 1474. The relatively greater heat flow through the backing plates 1440, 1442, 1460, and 1462 may help maintain a more uniform temperature among the bond pads during bonding, in embodiments where the bond pads associated with backing plates 1440, 1442, 1460, and 1462 have wider traces leading therefrom, and therefore conduct away more applied heat during bonding.

Figure 11:
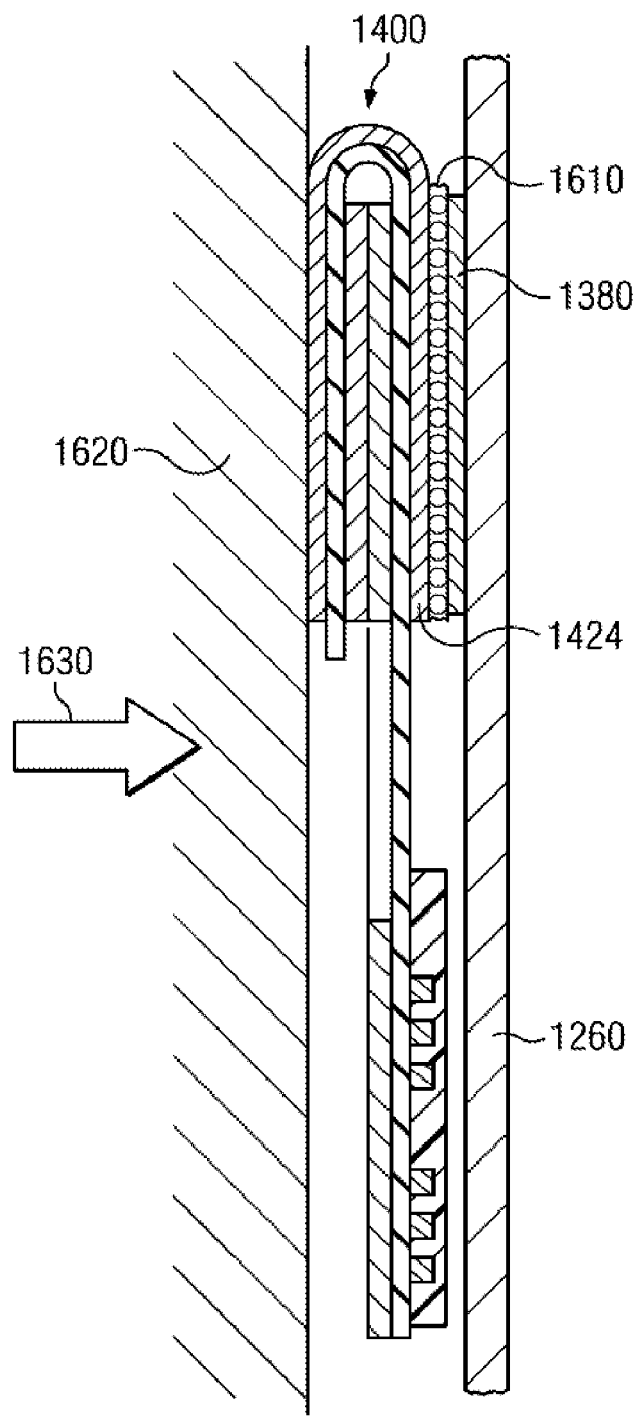
FIG. 11 depicts the bonding of a folded flexure bond pad to a corresponding flexible printed circuit bond pad by an anisotropic conductive film, according to an embodiment of the present invention.

In certain embodiments, each of the flexure bond pads (e.g. flexure bond pad 1424 in the embodiment of FIGS. 10A-C) may be bonded to a corresponding one of the plurality of FPC bond pads by an anisotropic conductive film (ACF). For example, FIG. 11 depicts the bonding of a flexure bond pad 1424 to a corresponding FPC bond pad 1380 by an ACF 1610. A thermode tool 1620 is brought into contact with the plurality of flexure bond pads after folding, with the thermode tool 1620 pressing the plurality of flexure bond pads (e.g. including flexure bond pad 1424) against the plurality of FPC bond pads (e.g. including the corresponding FPC bond pad 1380) for a period. In this context, one of ordinary skill would understand that the phrase "after folding" does not necessarily mean immediately after folding; rather, there could be intermediate steps.

The ACF 1610 may comprise an adhesive material that includes a plurality of electrically conductive beads of substantially similar diameter. In certain embodiments the ACF 1610 may employ beads of non-spherical shape, such as cylindrical beads. In certain embodiments the adhesive material may be deposited on to FPC bond pad 1380 prior to aligning the flexure bond pad 1424 thereto. Alternatively, the adhesive material may be deposited on to a first side of the flexure bond pad 1424 (facing the FPC bond pad 1380), after folding and prior to bringing the thermode tool 1620 into contact with an opposing second side of the flexure bond pad 1424 (facing the thermode tool 1620).

As shown in FIG. 11, the force 1630 that presses (via the thermode tool 1620) the flexure bond pad 1424 against FPC bond pad 1380 during the period of bonding, may arrange the plurality of electrically conductive beads in a monolayer with each of the plurality of electrically conductive beads in electrical contact with the flexure bond pad 1424 and the corresponding FPC bond pad 1380. The thermode tool 1620 may also transfer heat through flexure bond pad 1424 during the period of bonding, and raise the temperature of the adhesive material during such period, for example to accelerate curing of the adhesive material.

In certain embodiments, the force 1630 of the thermode tool 1620 is sufficient to cause the electrically conductive beads to be substantially elastically deformed in compression between the flexure bond pad 1424 and the corresponding FPC bond pad 1380 during the period of thermal curing of the adhesive material. After the thermode tool 1620 is removed, the electrically conductive beads cool (with the cured adhesive) from an elevated curing temperature. Such cooling causes the electrically conductive beads to shrink relative to their expanded size during thermal curing of the adhesive material.

However, the force 1630 is preferably chosen to be great enough that the post-curing shrinkage of the electrically conductive beads cannot completely relieve the compressive deformation that was experienced during curing. Hence, after curing and after removal of the thermode tool 1620, the electrically conductive beads may remain in compression (and somewhat compressively deformed) between the flexure bond pad 1424 and the corresponding FPC bond pad 1380.

Although residual compression of the electrically conductive beads may correspond to some residual tension in the cured adhesive material, such residual compression of the electrically conductive beads may be desirable to enhance and ensure reliable electrical conductivity of the ACF 1610. For example, in the case where the electrically conductive beads are spherical, the residual compression may cause small flat spots where the electrically conductive beads contact the flexure bond pad 1424 and the corresponding FPC bond pad 1380. Such flat spots can provide a finite contact areas rather than point contacts, which may desirably reduce the electrical resistance of the ACF 1610.

To help facilitate higher volume manufacturing, the thermode tool 1630 may include a flat surface that is substantially larger than any of the plurality of flexure bond pads, for example so that many bond pads may be subjected to the applied pressure and heat transfer simultaneously. The localized flexure tail thickness increases at the location of the bond pads, that result from folding the flexure tail 1400 as shown and described previously with reference to FIG. 10O, may advantageously allow a large flat thermode tool (e.g. thermode tool 1630) to provide pressure and heat only to the backing plate locations—without a need to first pattern or precisely align the thermode tool 1630. This may advantageously simplify high volume manufacture. That is, in certain embodiments of the present invention, the local thickness variations of the flexure tail 1400, that is caused by folding, may act as a self-aligning pattern to augment and assist the thermode tool 1630 to selectively apply pressure and heat more to desired bond pad locations of the flexure tail 1400 than to undesired locations (e.g. locations away from the bond pads).

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:
1. A disk drive comprising:
a disk drive base;
a disk rotably mounted to the disk drive base;
an actuator rotably mounted to the disk drive base, the actuator including at least one actuator arm and a flexible printed circuit (FPC) that includes a plurality of electrically conductive FPC bond pads; and at least one head gimbal assembly attached to the at least one actuator arm, the at least one head gimbal assembly comprising
- a read head that includes a write coil and a magneto-resistive read element; and
- a suspension assembly that comprises
  - a load beam, and
  - a laminate flexure that comprises a structural layer, a dielectric layer, and a conductive layer, the laminate flexure including a tongue portion that connects to the read head and a flexure tail that extends to the plurality of FPC bond pads;

wherein the flexure tail includes a first plurality of flexure bond pads in electrical communication with the write coil, each of the first plurality of flexure bond pads being aligned with a corresponding one of the plurality of FPC bond pads, and a second plurality of flexure bond pads in electrical communication with the magneto-resistive read element, each of the second plurality of flexure bond pads being aligned with a corresponding one of the plurality of FPC bond pads;

wherein each of the first plurality of flexure bond pads includes
- a widened region of a corresponding one of a first plurality of electrical traces in the conductive layer; and
- one of a first plurality of discontinuous islands in the structural layer;

wherein each of the second plurality of flexure bond pads includes
- a widened region of a corresponding one of a second plurality of electrical traces in the conductive layer; and
- one of a second plurality of discontinuous islands in the structural layer; and wherein a first width of at least one of the first plurality of discontinuous islands is greater than a second width of at least one of the second plurality of discontinuous islands.

2. The disk drive of claim 1 wherein the structural layer comprises stainless steel, the dielectric layer comprises polyimide, and the conductive layer comprises copper.

3. The disk drive of claim 2 wherein the thickness of the structural layer is less than 20 microns, the thickness of the dielectric layer is less than 15 microns, the thickness of the conductive layer is less than 15 microns, and a total thickness at each of the first plurality of flexure bond pads is at least 25 microns.

4. The disk drive of claim 1 wherein each of the first plurality of flexure bond pads is bonded to the corresponding one of the plurality of FPC bond pads by an anisotropic conductive film.

5. The disk drive of claim 1 wherein the structural layer includes a peripheral frame that defines and surrounds a structural layer window, the first and second pluralities of discontinuous islands being disposed within the structural layer window.

6. The disk drive of claim 5 wherein the structural layer window has a broken and open inner contour.

7. The disk drive of claim 1 wherein the flexure tail defines a flexure tail longitudinal axis, and wherein the widened regions of the first and second plurality of electrical traces each extend further transverse to the flexure tail longitudinal axis than parallel to the flexure tail longitudinal axis.

8. The disk drive of claim 7 wherein each of the widened regions defines a widened region width that is measured parallel to the flexure tail longitudinal axis, and wherein at least one of the first plurality of discontinuous islands defines a first island width that is measured parallel to the flexure tail longitudinal axis and that is in the range 1.1 to 2 times the widened region width.

9. The disk drive of claim 8 wherein at least one of the second plurality of discontinuous islands defines a second island width that is measured parallel to the flexure tail longitudinal axis and that is not greater than the widened region width.

10. The disk drive of claim 8 wherein the widened region width is in the range 90 to 230 microns.

11. The disk drive of claim 1 wherein the flexure tail defines a flexure tail longitudinal axis, and wherein the widened regions of the first and second plurality of electrical traces each extend further parallel to the flexure tail longitudinal axis than transverse to the flexure tail longitudinal axis.

12. The disk drive of claim 11 wherein each of the widened regions defines a widened region width that is measured transverse to the flexure tail longitudinal axis, and wherein at least one of the first plurality of discontinuous islands defines a first island width that is measured transverse to the flexure tail longitudinal axis and that is in the range 1.1 to 2 times the widened region width.

13. The disk drive of claim 12 wherein at least one of the second plurality of discontinuous islands defines a second island width that is measured transverse to the flexure tail longitudinal axis and that is not greater than the widened region width.

14. The disk drive of claim 1 wherein each of the first plurality of electrical traces in the conductive layer defines a first trace width in the range 80 microns to 230 microns, and each of the second plurality of electrical traces in the conductive layer defines a second trace width in the range 20 microns to 50 microns.

15. A head gimbal assembly (HGA) for a disk drive, the HGA comprising:
- a read head that includes a write coil and a magneto-resistive read element; and
- a suspension assembly that comprises
  - a load beam, and
  - a laminate flexure that comprises a structural layer, a dielectric layer, and a conductive layer, the laminate flexure including a tongue portion that connects to the read head and a flexure tail that extends away from the tongue portion;

wherein the flexure tail includes a first plurality of flexure bond pads in electrical communication with the write coil and a second plurality of flexure bond pads in electrical communication with the magneto-resistive read element;

wherein each of the first plurality of flexure bond pads includes a widened region of a corresponding one of a first plurality of electrical traces in the conductive layer; and
  one of a first plurality of discontinuous islands in the structural layer;

wherein each of the second plurality of flexure bond pads includes
  a widened region of a corresponding one of a second plurality of electrical traces in the conductive layer; and
  one of a second plurality of discontinuous islands in the structural layer; and wherein a first width of at least one of the first plurality of discontinuous islands is greater than a second width of at least one of the second plurality of discontinuous islands.

16. The HGA of claim 15 wherein each of the first plurality of flexure bond pads is coated by an anisotropic conductive film material.

17. The HGA of claim 15 wherein the structural layer includes a peripheral frame that defines and surrounds a structural layer window, the first and second pluralities of discontinuous islands being disposed within the structural layer window.

18. The HGA of claim 17 wherein the structural layer window has a broken and open inner contour.

19. The HGA of claim 15 wherein the flexure tail defines a flexure tail longitudinal axis, and wherein the widened regions of the first and second plurality of electrical traces each extend further transverse to the flexure tail longitudinal axis than parallel to the flexure tail longitudinal axis.

20. The HGA of claim 19 wherein each of the widened regions defines a widened region width that is measured parallel to the flexure tail longitudinal axis, and wherein at least one of the first plurality of discontinuous islands defines a first island width that is measured parallel to the flexure tail longitudinal axis and that is in the range 1.1 to 2 times the widened region width.

21. The HGA of claim 20 wherein at least one of the second plurality of discontinuous islands defines a second island width that is measured parallel to the flexure tail longitudinal axis and that is not greater than the widened region width.

22. The HGA of claim 20 wherein the widened region width is in the range 90 to 230 microns.

23. The HGA of claim 15 wherein the flexure tail defines a flexure tail longitudinal axis, and wherein the widened regions of the first and second plurality of electrical traces each extend further parallel to the flexure tail longitudinal axis than transverse to the flexure tail longitudinal axis.

24. The HGA of claim 23 wherein each of the widened regions defines a widened region width that is measured transverse to the flexure tail longitudinal axis, and wherein at least one of the first plurality of discontinuous islands defines a first island width that is measured transverse to the flexure tail longitudinal axis and that is in the range 1.1 to 2 times the widened region width.

25. The HGA of claim 24 wherein at least one of the second plurality of discontinuous islands defines a second island width that is measured transverse to the flexure tail longitudinal axis and that is not greater than the widened region width.

26. The HGA of claim 15 wherein each of the first plurality of electrical traces in the conductive layer defines a first trace width in the range 80 microns to 230 microns, and each of the second plurality of electrical traces in the conductive layer defines a second trace width in the range 20 microns to 50 microns.

27. A head gimbal assembly (HGA) for a disk drive, the HGA comprising:
 a read head that includes a write coil and a magneto-resistive read element; and
 a suspension assembly that comprises
  a load beam, and
  a laminate flexure that comprises a structural layer, a dielectric layer, and a conductive layer, the laminate flexure including a tongue portion that connects to the read head and a flexure tail that extends away from the tongue portion, the flexure tail defining a flexure tail longitudinal axis;

wherein the flexure tail includes a first plurality of flexure bond pads in electrical communication with the write coil and a second plurality of flexure bond pads in electrical communication with the magneto-resistive read element;

wherein each of the first plurality of flexure bond pads includes
 a widened region of a corresponding one of a first plurality of electrical traces in the conductive layer; and
 one of a first plurality of segments in the structural layer, each of the first plurality of segments being connected to another by one or more of a first plurality of narrow bridges in the structural layer;

wherein each of the second plurality of flexure bond pads includes
 a widened region of a corresponding one of a second plurality of electrical traces in the conductive layer; and
 one of a second plurality of segments in the structural layer, each of the second plurality of segments being connected to another by one or more of a second plurality of narrow bridges in the structural layer; and wherein a first width of at least one of the first plurality of segments, measured parallel to the flexure tail longitudinal axis, is greater than a second width of at least one of the second plurality of segments, measured parallel to the flexure tail longitudinal axis.

28. The HGA of claim 27 wherein successive connections by the first plurality of narrow bridges of the plurality of segments form a fishbone shape in the structural layer.

29. The HGA of claim 27 wherein successive connections by the first plurality of narrow bridges of the plurality of segments form a ladder shape in the structural layer.

30. The HGA of claim 27 wherein the structural layer includes a peripheral frame that defines and surrounds a structural layer window, the first and second pluralities of discontinuous islands being disposed within the structural layer window.

31. The HGA of claim 30 wherein the structural layer window has a broken and open inner contour.

32. The HGA of claim 27 wherein the flexure tail defines a flexure tail longitudinal axis, and wherein the widened regions of the first and second plurality of electrical traces each extend further transverse to the flexure tail longitudinal axis than parallel to the flexure tail longitudinal axis.

33. The HGA of claim 32 wherein each of the widened regions defines a widened region width that is measured parallel to the flexure tail longitudinal axis, and wherein at least one of the first plurality of discontinuous islands defines a first island width that is measured parallel to the flexure tail longitudinal axis and that is in the range 1.1 to 2 times the widened region width.

34. The HGA of claim 33 wherein at least one of the second plurality of discontinuous islands defines a second island width that is measured parallel to the flexure tail longitudinal axis and that is not greater than the widened region width.

35. The HGA of claim 27 wherein the flexure tail defines a flexure tail longitudinal axis, and wherein the widened regions of the first and second plurality of electrical traces each extend further parallel to the flexure tail longitudinal axis than transverse to the flexure tail longitudinal axis.

36. The HGA of claim 35 wherein each of the widened regions defines a widened region width that is measured transverse to the flexure tail longitudinal axis, and wherein at least one of the first plurality of discontinuous islands defines a first island width that is measured transverse to the flexure tail longitudinal axis and that is in the range 1.1 to 2 times the widened region width.

37. The HGA of claim 36 wherein at least one of the second plurality of discontinuous islands defines a second island width that is measured transverse to the flexure tail longitudinal axis and that is not greater than the widened region width.

38. The HGA of claim 27 wherein each of the first plurality of electrical traces in the conductive layer defines a first trace width in the range 80 microns to 230 microns, and each of the second plurality of electrical traces in the conductive layer defines a second trace width in the range 20 microns to 50 microns.

* * * * *